US008326400B2

(12) United States Patent
Taxt et al.

(10) Patent No.: US 8,326,400 B2
(45) Date of Patent: Dec. 4, 2012

(54) METHOD OF MR IMAGING

(75) Inventors: Torfinn Taxt, Bergen (NO); Renate Grüner, Bergen (NO)

(73) Assignee: Stiftelsen Universitetsforskning Bergen, Bergen (NO)

( * ) Notice: Subject to any disclaimer, the term of this patent is extended or adjusted under 35 U.S.C. 154(b) by 1305 days.

(21) Appl. No.: 11/592,976

(22) Filed: Nov. 6, 2006

(65) Prior Publication Data

US 2007/0167731 A1    Jul. 19, 2007

Related U.S. Application Data

(60) Provisional application No. 60/567,647, filed on May 4, 2004.

(30) Foreign Application Priority Data

Nov. 10, 2005    (GB) .................................. 0522986.9

(51) Int. Cl.
  *A61B 5/05*    (2006.01)
(52) U.S. Cl. .......................... 600/420; 600/410; 382/128
(58) Field of Classification Search .................. 600/410, 600/411, 419, 420; 382/279, 282; 424/9.3
  See application file for complete search history.

(56) References Cited

U.S. PATENT DOCUMENTS 7,885,442 B2 *    2/2011    Lorenz et al. .................. 382/128
2004/0096088 A1 *    5/2004    Kohle ............................ 382/128

OTHER PUBLICATIONS

F. Tsumuraya, Deconvolution based on the Wiener-Lucy chain algorithm: an approach to recover local information loss in the doconvolution procedure, J. Opt. Soc. Am. A, 1996, vol. 13, pp. 1532-1536.*
E. Vonken, et al, "Simultaneous Quantitative Cerebral Perfusion and GD-DTPA Extravasation Measurement With Dual-Echo Dynamic Susceptibility Contrast MRI", Magnetic Resonance in Medicine, 2000, vol. 43, pp. 820-827.*
F. Calamante, et al., "Delay and Dispersion Effects in Dynamics Susceptibility Contrast MRI: Simulations Using Singular Value Decomposition", Magnetic Resonance in Medicine, 2000, vol. 44, pp. 466-473.*
C. Kiefer, et al., "Measurement of cerebral blood flow in MRI using a nonparametric deconvolution techn~ue with ener com ensation", Proc. Intl. Soc. Ma . Reson. Med., 2001, vol. 9, .1582.*
Carroll et al., "Automatic Calculation of the arterial input function for cerebral perfusion imaging with MR imaging", 2003, Radiology, pp. 593-600.*

(Continued)

*Primary Examiner* — Brian Casler
*Assistant Examiner* — Christopher Cook
(74) *Attorney, Agent, or Firm* — Bacon & Thomas, PLLC

(57) ABSTRACT

The invention provides, in a method of perfusion magnetic resonance imaging of a region of interest in a vascularized animal subject, said method comprising administering a contrast agent bolus into the vascular system of said subject; determining the magnetic resonance signal strength $s_i(t)$ for voxels (i) of said region of interest at a series of time values (t) over a period from before contrast agent arrival in said region of interest to at least the end of the first pass of said contrast agent through said region of interest; from the determined values $s_i(t)$ for said signal strength and an arterial input function $v(t)$, determining values for the tissue residue function $r_i(t)$ for each said voxel; and optionally generating an image of said region of interest from the determined values of $r_i(t)$; the improvement comprising generating from $s_i(t)$ a voxel specific arterial function $v_i(t)$ and using said voxel specific arterial function to determine the values of the tissue residue function $r_i(t)$.

28 Claims, 22 Drawing Sheets

OTHER PUBLICATIONS

L. Ostergaard, et al., "High Resolution Measurement of Cerebral Blood Flow Using Intravascular Tracer Bolus Passages. Part II: Experimental Comparison and Preliminary Results", Magnetic Resonance in Medicine, Academic Press, Duluth, MN, US, 1996, vol. 36, pp. 726-736.

D.Y. Riabkov, et al., "Estimation of Kinetic Parameters Without Input Functions: Analysis of Three Methods for Multichannel Blind Identification", IEEE Transactions on Biomedical Engineering, 2002, vol. 49, pp. 1318-1327.

J.S. Lee, et al., "Robust extraction of input function from H2<15>0 dynamic myocardial positron emission tomography using independent component analysis", Nuclear Science Symposium, 1999, Conference Record, 1999 IEEE Oct. 24-30, 1999, Piscataway, NJ, vol. 2, pp. 990-994

C.C. Quarles, et al., "Reliability of Measuring Tumor Perfusion using Dynamic Susceptibility Contrast MRI: The Influence of Vascular Structure and Imaging Technique", Proc., Intl. Soc. Mag. Reson. Med., 2002, vol. 10.

F. Calamante, et al., "Quantification of bolus-tracking MRI: improved characterization of the residue function using Tikhonov regularization", Proc. Intl. Soc. Mag. Reson. Med., 2003, vol. 11, pp. 2186.

* cited by examiner

METHOD OF MR IMAGING

This application is a continuation-in-part application of pending international application number PCT/GB05/01680, filed May 4, 2005, of which the entire disclosure of the pending, prior application is hereby incorporated by reference. This application is claiming benefit under 35 U.S.C. 119(e) of provisional application No. 60/567,647 filed May 4, 2004.

FIELD OF THE INVENTION

The invention relates to a method of magnetic resonance (MR) imaging, in particular perfusion imaging, as well as to methods of post-imaging data manipulation and programs therefor.

BACKGROUND TO THE INVENTION

MR Imaging can be used to detect both physical structure within the body and tissue function and viability. One imaging technique of particular interest for use with patients with brain, heart or liver damage, e.g. as a result of stroke, tumours, infarct, etc., is termed perfusion imaging.

In this technique, a bolus of an MR contrast agent (e.g. a gadolinium chelate such as those marketed as Omniscan® or Magnevist® by Amersham and Schering) is administered into the patient's vascular system and MR images from the region of interest are collected for a period covering the transit of the contrast agent bolus through the tissue in the region of interest. To this end, fast image acquisition sequences, e.g. spin echo, gradient recall (GRASS or FLASH), echo planar (EPI), RARE, hybrid, half excitation, etc. are used. Such sequences and bolus administration of MR contrast agents for perfusion imaging are well known in the art (see for example "Biomedical Magnetic Resonance Imaging", Ed. Wehrli et al, VCH, 1988).

In clinical practice, it is common for the perfusion image series to be inspected and the results to be assessed qualitatively.

However in many instances a quantified result, e.g. an absolute measurement of regional blood flow, regional blood volume, regional mean transit time, regional time of arrival and regional time to peak are desired (see for example Rempp et al, Radiology 193: 637-641 (1994) and Vonken et al, MRM 41: 343-350 (1999)).

Using classical tracer kinetic theory, dynamic MR perfusion images are analysed to extract the tissue residue function, $r(t)$, for each voxel. From $r(t)$, quantified values for the regional parameters mentioned above may be determined. However, the local contrast signals, $c(t)$, which for T2* may be extracted from the ratio of MR signal intensity ratio at time t to MR signal intensity at time 0 (i.e. before contrast agent arrival at the tissue of interest) is a convolution of $r(t)$ and an arterial input function $v(t)$. Similar procedures are used to extract $c(t)$ from T1 weighted images.

$r(t)$ describes the fraction of contrast agent still present in a tissue region at time t and is thus a function dependent on the physiological parameters of the tissue, e.g. blood volume and mean transit time. $v(t)$ describes how the contrast agent is delivered to the tissue voxel, and as such gives an impression of the vascular structure in the organ. Conventionally, $v(t)$ is assumed to be invariant spatially, i.e. in determining $r_i(t)$ from $c_i(t)$ a voxel, i, independent value for $v(t)$ is determined and $r_i(t)$ is determined by deconvolving $r_i(t)*v(t)$. Thus $$c_i(t) = k \cdot \ln \frac{s_i(t)}{s_i(o)} = r_i(t) * v(t)$$

(where k is a constant dependant on the parameters used in the imaging technique, and $s_i(t)$ is the signal intensity for voxel i at time t).

SUMMARY OF THE INVENTION

We have now surprisingly found that by determining a voxel specific value of $v_i(t)$ from the MR image intensity signal $s_i(t)$, significantly more clinically informative values of $r_i(t)$ and hence of the regional parameters mentioned above may be determined. Additionally, by visualizing $v_i(t)$ as a function of time, the blood supply pattern of the organ can be appreciated.

Thus viewed from one aspect the invention provides, in a method of perfusion magnetic resonance imaging of a region of interest in a vascularized animal subject, said method comprising: administering a contrast agent bolus into the vascular system of said subject; determining the magnetic resonance signal strength $s_i$ (t) for voxels (i) of said region of interest at a series of time values (t) over a period from before contrast agent arrival in said region of interest to at least the end of the first pass of said contrast agent through said region of interest; from the determined values $s_i(t)$ for said signal strength and an arterial input function $v(t)$, determining values for the tissue residue function $r_i(t)$ for each said voxel; and optionally generating an image of said region of interest from the determined values of $r_i(t)$; the improvement comprising generating from $s_i(t)$ a voxel specific arterial function $v_i(t)$ and using said voxel specific arterial function to determine the values of the tissue residue function $r_i(t)$.

Viewed from a further aspect the invention provides a method of perfusion magnetic resonance imaging data manipulation, said method comprising: obtaining a set of magnetic resonance signal strength values $s_i(t)$ for voxels (i) of a region of interest in a vascularized subject into the vasculature of which a magnetic resonance contrast agent bolus has been administered, said signal strength values being for a series of time values (t) over a period from before contrast agent arrival in said region of interest to at least the end of the first pass of said contrast agent through said region of interest; from said set of signal strength values $s_i(t)$ and an arterial input function $v(t)$, determining values for the tissue residue factor $r_i(t)$ for each said voxel; and optionally generating an image of said region of interest from the determined values of $r_i(t)$; the improvement comprising generating from $s_i(t)$ a voxel-specific arterial function $v_i(t)$ and using said voxel-specific arterial function to determine the values of the tissue residue function $r_i(t)$.

Viewed from a further aspect the invention provides a method of perfusion magnetic resonance imaging or a method of perfusion magnetic resonance imaging data manipulation wherein the signal strength values are corrected for contrast agent leakage effects and/or for contrast agent recirculation effects.

Viewed from a further aspect the invention provides a method of perfusion magnetic resonance imaging or a method of perfusion magnetic resonance imaging data manipulation wherein the contrast signal for each voxel is split into and second pass components with no leakage and with a leakage component.

Viewed from a further aspect the invention provides a method of perfusion magnetic resonance imaging or a method of perfusion magnetic-resonance imaging data manipulation wherein the Richardson-Lucy deconvolution algorithm is used to estimate the tissue residue function and subsequently estimate the arterial input function, then the Wiener deconvolution filter is used to find a new estimate of the tissue residue function from the estimate of the arterial input function.

Viewed from a further aspect the invention provides a method of perfusion magnetic resonance imaging or a method of perfusion magnetic resonance imaging data manipulation wherein the Richardson-Lucy deconvolution algorithm and the Wiener deconvolution filter are used sequentially in an iterative loop.

Viewed from a further aspect the invention provides a method of perfusion magnetic resonance imaging or a method of perfusion magnetic resonance imaging data manipulation wherein the Richardson-Lucy deconvolution algorithm is used to estimate the tissue residue function and subsequently estimate the arterial input function.

Viewed from a further aspect the invention provides a method of perfusion magnetic resonance imaging or a method of perfusion magnetic resonance imaging data manipulation wherein the Richardson-Lucy deconvolution algorithm modified by the Poisson Bayes model or by regularisation, is used to estimate the tissue residue function and subsequently estimate the arterial input function.

Viewed from a further aspect the invention provides a method of perfusion magnetic resonance imaging or a method of perfusion magnetic resonance imaging data manipulation wherein the Richardson-Lucy deconvolution algorithm is used in an iterative loop.

Viewed from a further aspect the invention provides a method of perfusion magnetic resonance imaging or a method of perfusion magnetic resonance imaging data manipulation wherein a parametric perfusion image is generated.

Viewed from a still further aspect the invention provides a computer software product carrying instructions which when executed on data processing apparatus for use in a method of perfusion magnetic resonance imaging of the current invention will cause the apparatus to be configured to receive as an input a set of magnetic resonance signal strength values $s_i(t)$ for voxels (i) of a region of interest in a vascularized subject into the vasculature of which a magnetic resonance contrast agent bolus has been administered, said signal strength values being for a series of time values (t) over a period from before contrast agent arrival in said region of interest to at least the end of the first pass of said contrast agent through said region of interest, and to generate therefrom a voxel specific arterial function $v_i(t)$, a voxel specific tissue residue factor $r_i(t)$, and optionally an image of said region of interest. The input to the computer program may be the raw signal strength values themselves or more preferably normalised signal strength values $(s_i(t)/s_i(0))$ or the logarithms of normalised signal strength values.

Viewed from a still further aspect the invention also provides a data processing apparatus for use in a method of the invention of perfusion magnetic resonance imaging, the apparatus being configured to receive as an input a set of magnetic resonance signal strength values $s_i(t)$ for voxels (i) of a region of interest in a vascularized subject into the vasculature of which a magnetic resonance contrast agent bolus has been administered, said signal strength values being for a series of time values (t) over a period from before contrast agent arrival in said region of interest to at least the end of the first pass of said contrast agent through said region of interest, and to generate therefrom a voxel specific arterial function $v_i$(t), a voxel specific tissue residue factor $r_i$(t), and optionally an image of said region of interest.

The data processing apparatus is preferably an apparatus also arranged to control a magnetic resonance imager.

The method of the invention offers a significant improvement over prior art methods for obtaining parametric perfusion images (e.g. rCBV, rCBF, rMTT and regional time of arrival) in that an arterial input function is automatically generated which is voxel-specific. In contrast, in the prior art methods a manual, interactive step is required and the arterial input function used is the same for all voxels. For performance of the method of the invention it is only necessary for the values of the parameters used in the algorithms herein to be set in accordance with the characteristics of the imaging device and imaging sequence, and optionally the contrast agent. Appropriate parameter settings may thus be preloaded into the computer program used to perform parametric perfusion image generation such that the operator need only specify to the computer the nature of the contrast agent used. In effect the program supplied by the machine manufacturer may contain a look-up table so that the appropriate values of the parameters needed for the calculation may then be selected automatically.

Although explained in further detail below, the data manipulation in the process and method of the invention generally involves Fourier transformation of a normalized signal strength function (normally proportional to $\ln s_i(t)/s_i(0)$) for each voxel to yield values of a function $c_i(\omega)$, log complex transformation of $c_i(\omega)$ to yield $\hat{c}_i(\omega)$, inverse Fourier transformation of $\hat{c}_i(\omega)$ to yield $\hat{c}_i(t)$, separation of $\hat{c}_i(t)$ into a short time function $\hat{r}_i(t)$ and a longer time function $\hat{v}_i(t)$, and reversal of the procedure to transform $\hat{v}_i(t)$ into $v_i(t)$. $r(t)$ is subsequently obtained by deconvolution using Wiener filtering or other deconvolution methods. The separation of $\hat{c}_i(t)$ into $\hat{v}_i(t)$ and $\hat{r}_i(t)$ may and generally will involve iterative fitting of the component functions following an initial filtering or under weighing of the function $\hat{c}_i(t)$ at the position where the components overlap.

The generation of the original parameters mentioned above, and/or of images of the region of interest, from the determined value of $r_i(t)$ may be performed in conventional fashion.

An alternative strategy also part of this invention is the use of blind iterative deconvolution methods to simultaneously estimate the tissue residue function and the arterial input function voxel for voxel. One possibility for the iterative algorithm is to combine two deconvolution methods; e.g. the Richardson-Lucy deconvolution algorithm to isolate one of the convolved functions, and then again the use of the Richardson-Lucy function to obtain the second function, then the Wiener deconvolution filter algorithm to obtain a better estimate of the first function and so forth. In this way one may counteract the limits of either method. Alternatively, Richardson-Lucy deconvolution could be used in all iterations. These approaches are further described below.

The fast imaging technique used in the method of the invention will conveniently be any technique capable of image acquisition with a time delay of less than 2 seconds between each slice, preferably 1.5 seconds, preferably one with an image acquisition time of less than 1 second, more preferably less than 100 milliseconds. The imaging techniques mentioned above may be used to this end. The use of echoplanar sequences based on spin echo ($T_2$ imaging) or gradient echo ($T_2^*$ imaging) signal generation is preferred, especially gradient echo echoplanar imaging.

$T_2^*$ imaging will preferably be used.

While conventional MR contrast agents, such as Gd DTPA, Gd DTPA-BMA and Gd HPDO3A which distribute into the extra cellular fluid, may be used in the method of the invention, where the organ or tissue to be imaged is other than the brain it may be preferable to use instead a blood pooling contrast agent, i.e. one which remains within the vasculature. Such agents are well documented in the patent publications of the MR contrast agent manufacturers, e.g. Schering, Amersham, Nycomed, etc.

DETAILED DESCRIPTION OF THE INVENTION

The tissue concentration of an intravascular contrast agent c(t), depends on the tissue flow F, tissue function r(t), and the arterial input function v(t). The functional relationship is a convolution between r(t) and v(t), $$c(t) = F \cdot r(t) * v(t) = u(t) * v(t) \qquad (1)$$

where $u(t) = F \cdot r(t)$. The residue function r, describes the fraction of contrast still present in a tissue region at time t after instantaneous injection, and is thus a function of the physiological parameters of the tissue (blood volume and mean transit time). The flow F, can be obtained from the initial height of the deconvolved contrast concentration function, as no contrast has left the tissue at time t=0 (r(0)=1). In Eq. (1), extravascular leakage and recirculation of contrast have been ignored. This is a sufficient approximation in perfusion studies with an intact blood brain barrier, and when only time point measurements representative of the first pass of the contrast agent are analyzed.

Eq. (1) is valid for each voxel (i), which has its own specific arterial input function and tissue residue function $$c_i(t) = u_i(t) * v_i(t) \qquad (2)$$

A voxel specific arterial input function includes any delay $\delta$, and dispersion g, of the arterial input function from the injection vein w(t), on its passage to the observed tissue $$v_i(t) = w(t) * g_i(t) * \delta_i(t - t_{0i}) \qquad (3)$$

where $t_{0i}$ is the arrival time of contrast bolus in voxel (i). The vascular transport function described in the literature is thus expressed by the convolution between g and $\delta$.

Before using Eq. (2) in MR perfusion imaging, $c_i(t)$ must be related to the corresponding change in MR signal intensity, $s_i(t)$. A linear relationship between the relaxation properties of the tissue and the contrast concentration is a good approximation for echo-planar imaging experiments, $$c_i(t) = \frac{-k}{TE} \cdot \ln \frac{s_i(t)}{s_i(0)} \qquad (4)$$

where TE is echo time, $s_i(0)$ is the constant signal intensity before the contrast injection. The proportionality constant k, depends on the magnetic field strength, the type of contrast agent and the imaging sequence parameters.

The complex cepstrum is a special frequency representation of an observed signal. If the observed signal is a collection of several individual signals, which belong to separate bands in the complex cepstrum, signal decomposition is possible by filtering the complex cepstrum. In the present invention, complex cepstrum analysis may be applied to the convolution in Eq. (2) in order to determine voxel specific arterial input functions.

A complex cepstrum representation is obtained by homomorphic transformation of the signal of interest. Several homomorphic transformations exist, resulting in different cepstrums, like the bicepstrum, the spectral root cepstrum, the generalised cepstrum and the complex cepstrum. The homomorphic transformation used to compute the complex cepstrum, is the complex logarithmic function, log, which has the complex exponential function, $Ae^{i\emptyset} = A \cos(\emptyset) + iA \sin(\emptyset)$, as inverse. This homomorphic transformation can be computed in different ways, including a Fourier transform method and a complex root extraction procedure. In the Fourier method, the Fourier transformation, F, is applied to the convolution in Eq. (2)

$$C_i(z = e^{jw}) = F[c_i(t)] = F[v_i(t)] \cdot F[u_i(t)] \qquad (5)$$

$$\hat{C}_i(z) = \log(C_i(z)) = \log([v_i(t)]) + \log([u_i(t)]) \qquad (6)$$

Inverse Fourier transforming ($F^{-1}$) the expression for $\hat{C}_i(z)$, gives the desired complex cepstrum representation, $\hat{c}_i(t) = \hat{v}_i(t) + \hat{u}_i(t)$. Thus, a linear relationship between the two convolved functions in Eq. (2) may be established. Computationally demanding phase unwrapping schemes and aliasing due to finite Fourier representation, however, can be a problem using this approach and instead complex root extraction as described below, and which is not affected by aliasing, is preferably used in the method of the invention.

The contrast signals in Eq. (2), $\hat{c}_i(t)$, $t \in [1, T]$ are real, stable and finite. In this case, $C_i(z)$, the z transform of $c_i(t)$, is analytic in a region that includes the unit circle, and can be expressed as a complex polynomial of degree $N = M_i + M_o$, $$C_i(z) = |A_i| \prod_{k=1}^{M_i} (1 - a_{i,k} z^{-1}) \prod_{k=1}^{M_o} (1 - b_{i,k} z^{-1}) \qquad (7)$$

The coefficients, $|a_{i,k}| \leq 1$ and $|b_{i,k}| \leq 1$, so that the factorization terms in Eq. (7) represent $M_i$ zeros and $M_o$ zeros inside and outside the unit circle, respectively. The complex logarithm of Eq. (7) is $$\hat{C}_i(z) = \log|A_i| + r \cdot \log(z) + \Sigma_{k=1}^{M_i} \log(1 - a_{i,k} z^{-1}) + \Sigma_{k=1}^{M_i} \log(1 - b_{i,k} z) \qquad (8)$$

Thus, by using a numerical polynomial rooting algorithm, the complex zeroes $a_{i,k}$ and $1/b_{i,k}$ of Eq. (8) can be computed directly. The complex cepstrum $\hat{c}_i(t)$, can be computed according to $$\hat{c}_i(t) = \begin{cases} \log|A_i| & t = 0 \\ -\sum_{k=1}^{M_i} \frac{a_{i,k}^t}{t} & t < 0 \\ -\sum_{k=1}^{M_o} \frac{b_{i,k}^{-t}}{t} & t > 0 \end{cases}$$

Perfusion imaging series, of typically 50 time point measurements, give convergence and stable results in in vivo evaluations. By only including image frames representative of the first pass of the contrast bolus (e.g. 22 time point measurements), computation time may advantageously be decreased.

The linear relationship in the complex cepstrum $\hat{c}_i(t) = \hat{v}_i(t) + \hat{u}_i(t)$, means that if the two derived functions are located in different bands in the complex cepstrum, then they can be separated by simple ideal band pass filtering. Correct separation is important to determination of the voxel specific arterial input functions. After ideal low pass filtering, the complex cepstrum may be assumed to be $\hat{c}_i(t)=\hat{v}_i(t)$. Next, inverse homomorphic transformation, based on the Fourier method, may be applied to the filtered-complex cepstrum data to obtain $v_i(t)$. The first step is to transform v to the logarithmic Fourier domain, $F^1(V_i)=V_i(e^{i\omega})$, and then to the ordinary Fourier domain, $V_i(z=e^{i\cdot})$. All arterial input functions estimated according to this procedure may be normalised to unit area in the spatial domain, because any multiplicative coefficient to the arterial input function cannot be uniquely determined from the cepstrum separation. A possible physical explanation of this normalisation is that the same amount of contrast agent, in this case a contrast bolus of unit area, passes through each image voxel. Thus, assuming that the shape of the voxel specific arterial input function is correctly reproduced, only a scaling factor separates it from the corresponding manually selected arterial input function.

Simple frequency domain Wiener filtering is the preferred method for deconvolving the voxel specific arterial input functions and the tissue residue function according to $$U_i(e^{i\omega}) = C_i(e^{i\omega}) \frac{V_i^*(e^{i\omega})}{|V_i(e^{i\omega})|^2 + q_i} \qquad (9)$$

The parameter $q_i$ is the squared, inverse signal-to-noise ratio of the computed contrast concentrations. This Wiener filter gives the maximum a posteriori probability estimate of the original signal with the corrupting noise modelled as independent Gaussian processes, and the signal-to noise ratio taken as constant for all frequencies. The Wiener filtering method could be replaced by any other standard deconvolution method, e.g. regularization, singular value decomposition or maximum likelihood based methods.

While in certain instances the method of the invention may be carried out without taking into consideration the possibility of contrast agent leakage out of the vasculature or of contrast agent recirculation, it is generally desirable to take account of these factors, especially where the contrast agent is a simple chelate which distributes into the extracellular fluid (rather than a blood pool agent which is retained in the blood).

Almost all tissues have a substantial leakage of contrast across the capillary membranes, except for normal brain tissue. Many brain tumors do not have an intact blood-brain barrier, and leak contrast out into the extravascular space. The leakage usually gives a significant contribution to the contrast signal, and should not be ignored in the determination of the voxel specific arterial input functions. To estimate the leakage term, the late part of the first pass contrast signal has to be considered. This late signal part is generally contaminated by the signal of the recirculated contrast. Hence, recirculation effects should desirably be included in the determination of the voxel specific arterial input functions.

Thus in a preferred embodiment, the contrast signal of each voxel is split into first pass and second pass components with no leakage and with a leakage component. Then, an initial estimate of each voxel specific arterial input function is obtained through filtering in the complex cepstrum domain. It has, however, been seen that the final results are not substantially influenced by the initialization provided that all initial values are larger than zero. Thereafter, the one-dimensional iterative Lucy-Wiener deconvolution method may be used to improve the initial calculated values for each voxel specific arterial input function and its corresponding tissue residue function and leakage term.

In this embodiment, the additive terms of the contrast signal due to recirculation and leakage are removed first, using standard models for leakage and recirculation (see Vonken et al., MRM 43: 820-827 (2000)). Estimation of these additive terms may be done using Picard iterations and simple properties of the contrast signal in the spatial or Fourier domain. After the removal of the additive terms, the first pass signal is isolated.

An initial estimate of the arterial input function in each voxel is obtained using the complex cepstrum analysis.

The resulting initial estimates of the arterial input functions may be used as the input to a nonparametric deterministic image constraints deconvolution algorithm (see Kundur et al., IEEE Signal Processing Magazine 13: 43-64 (1996)). In these algorithms, deterministic constraints of non negativity and known finite support of both the arterial input functions and the tissue residue functions are used. Estimates of the voxel specific tissue residue-functions and of the arterial input functions are updated iteratively to a local optimum. For each iteration, the prior image constraints are enforced.

There is a large class of nonparametric deterministic image constraints deconvolution algorithms (see Kundur et al., IEEE Signal Processing Magazine 13:43-64 (1996)). Some of the older and most well known are the iterative blind deconvolution algorithm, the non negativity and support constraints recursive inverse filtering algorithm, and a simulated annealing algorithm. A good review of these algorithms and others is given in Kundur (supra).

A recent development of nonparametric deterministic image constraints deconvolution algorithms is iterative chain algorithms (see Tsumuraya et al., J. Opt. Soc. Am. A 13: 1532-1536 (1996)). These algorithms combine two different deconvolution algorithms in sequence to exploit the advantages of both. In the preferred embodiment now described, the one-dimensional iterative Lucy-Wiener deconvolution algorithm is used to improve the initial estimates of each voxel specific arterial input function and its corresponding tissue residue function. The choice of the iterative Lucy-Wiener deconvolution algorithm is advantageous because no parameters have to be set manually and the two deconvolution algorithms in each iterative step tend to cancel the negative effects each of the algorithms has on the deconvolution result when used alone. This has been confirmed on simulated data and on in vivo data. The results were much less affected by noise than those obtained with the preceding algorithms.

The contrast signal model with leakage, but no recirculation for a single voxel, i, is:

$$c_i(t) = F_i \cdot r_i(t) * v_i(t) + \kappa_i \cdot \int_0^t F_i \cdot r_i(\tau) * v_i(\tau) d\tau + v_i(t) \qquad (10)$$

where $c_i(t)$ is the contrast signal, $F_i$ blood flow, $r_i(t)$ the tissue residue function, $v_i(t)$ the arterial input function, $\kappa_i$ the leakage constant and $v_i(t)$ the noise signal, which is usually assumed uncorrelated and Gaussian distributed.

In the simple standard prior art model, the recirculated fraction of the contrast, $m \in <0,1>$ is a parameter assumed common for all voxels. Also the additional arterial input function due to recirculation of the contrast once through the circulation system, v0(t), is assumed common for all voxels. These assumptions have been thought to be reasonable due to the structure of the body and the cardiovascular system. The recirculation time, $T_i$, is specific for each voxel. Using these assumptions, the voxel specific contrast signal model with one recirculation of contrast, but no leakage becomes:

$$c_i(t)=F_i \cdot r_i(t)*v_i(t)+m \cdot v0(t)*[(F_i \cdot r_i(t)*v_i(t+T_i)]+v_i(t) \quad (11)$$

Combining Eqs. (10) and (11) gives the voxel specific contrast signal model with leakage and recirculation time $T_i$;

$$c_{ij}(t) = F_i \cdot r_i(t)*v_i(t) + m \cdot \left( F_i \cdot r_i(t)*v0(t)*v_i(t+T_i) + \kappa_i \cdot \int_0^t F_i \cdot r_i(\tau)*v_i(\tau)d\tau + \kappa_i \cdot \int_0^t F_i \cdot r_i(\tau)*v0(\tau)*v_i(\tau+T_i)d\tau \right) + v_i(t) \quad (12)$$

The Fourier domain of Eq. (12) can be factorized in the convenient form $$C_i(\omega) = F_i \cdot R_i(\omega) \cdot V_i(\omega) * \left(1 + \frac{\kappa_i}{j\omega}\right) \cdot (1 + m \cdot V0(\omega) \cdot e^{-jT_i\omega}) + N_i(\omega) \quad (13)$$

where the upper case letters symbolizes the Fourier transform of the corresponding time signals given by the same lower case letters. When contrast leakage and recirculation can be ignored, Eq. (13) simplifies to the complex product $$C_i(\omega)=F_i \cdot R_i(\omega) \cdot V_i(\omega)+N_i(\omega) \quad (14)$$

This is the standard starting expression used previously for estimating the arterial input function, $v_i(t)$, in the complex cepstrum domain. The noise term, $N_i(\omega)$ is ignored. However, usually contrast leakage and recirculation cannot be ignored, so the estimation of $v_i(t)$ has to be based on Eq. (13). Hence, the contributions of the contrast leakage and recirculation have to be removed from the contrast signal, $c_i(t)$, before the arterial input function is estimated. Otherwise, the functions $$1 + \frac{\kappa_i}{j\omega}$$

and $1+m \cdot e^{-jT\omega}$ will corrupt the estimation of the slowly changing function $v_i(t)$.

Denoting the first pass contrast signal without leakage $$d_i(t)=F_i \cdot r(t)*v_i(t) \quad (15)$$

and ignoring the noise term, Eq. (13) can be simplified to $$C_i(\omega) = D_i(\omega) * \left(1 + \frac{\kappa_i}{j\omega}\right) \cdot (1 + m \cdot V0(\omega) \cdot e^{-jT_{ij}\omega}) \quad (16)$$

Thus, for each contrast signal, optimal estimation of $d_i(t)$ corresponds to optimal estimation of the global parameter m, the global recirculation function $v0(t)$ and all the voxel specific leakage constants, $\kappa_i$, and local recirculation times, $T_i$, i=1,2, N, where N is the number of voxels within the region of interest.

To simplify the estimation problem, $v0(t)$ is simply selected as a Gaussian or a Gamma function where the parameters are set manually for a given acquisition sequence and all patients. This is a reasonable first order approximation since the vascular system properties are similar for all humans. In preliminary experiments, a Gaussian distribution with mean zero and standard deviation 2 worked best with the acquisition parameters used.

All three remaining parameters can be optimized, but here the recirculation fraction, m, is fixed to value 0.05 based on preliminary experiments, varying m in the interval [0.025-0.200]. Again, this is a reasonable first order approximation since the vascular system permeability properties are similar for all humans. Optimizing the value of m with small incremental steps is straight forward, but may increase the total computation time substantially.

The parameters $\kappa_i$ and $T_i$ may be optimized in the spatial or Fourier domain using a simple Picard relaxation algorithm with 5 iterations (see Kreyszig "Advanced Engineering Mathematics", John Wiley, NY, 1999, page 1156). It may be assumed that the late part of the contrast signal curve represents a steady state, where there is an equilibrium of contrast between the intravascular and extravascular spaces. An initial value for $\kappa_i$ is found by ignoring any recirculation effects and using the steady state assumption (see Vonken(supra)). The optimizing criterion is simply the total distance between the estimated function with leakage and recirculation and the observed concentration signal.

For each estimate of $\kappa_i$ the optimal value of $T_i$ is determined by testing all possible integer values of $T_i$ within a prespecified range. Lower and upper limits for $T_i$ can be specified dependent on the body part which is being examined.

Once the optimization is finished, the first pass contrast signal, $d_i(t)$, is known. After substitution of $c_i(t)$ with $d_i(t)$, Eq. (14) can then be used as a starting point for determination of the voxel specific arterial input function $v_i(t)$, using complex cepstrum analysis as before.

In the preferred embodiment now described, the iterative Lucy-Wiener deconvolution algorithm is introduced to obtain better estimates of both the voxel specific arterial input functions and the voxel specific tissue residue functions. The arterial input function estimates from the complex cepstrum filtering are used only as initial estimates.

The Lucy-Wiener deconvolution algorithm is a combination of two deconvolution algorithms. The first part is the Richardson-Lucy deconvolution algorithm, which works in the spatial domain for images with additive Poisson distributed noise. It is an expectation maximization (EM) algorithm given by $$r_{j+1}(x) = \left\{ \left[ \frac{c(x)}{r_j(x)*v(x)} \right] * v(-x) \right\} r_j(x), \quad (17)$$

where j is the iteration number. The index i, denoting the voxel, has been suppressed. This algorithm is popular and used extensively by the astrophysical community to deconvolve speckled astronomical images recorded through the atmosphere. It satisfies the image constraints of positivity, energy conservation and support automatically. As this model has an inherent positivity constraint the number of possible solutions are therefore reduced and physiologically meaningful results can be obtained.

Further, the conservation of contrast may optionally be forced by normalising the arterial input functions to the same (unit) area, to assure that the same amount of contrast passes through all voxels.

Further, the arterial input function may be restricted to the same time bins as the first pass contrast signals, i.e. time points after the pre-bolus and before those identified by the leakage model as non-first pass. The tissue residue function is restricted to the first time points.

As it is an EM algorithm, it is guaranteed to converge to an optimum, when used alone. The optimum is the maximum posterior probability or likelihood, given the input functions. Assuming that the additive noise is Gaussian, a different EM algorithm results, which does not guarantee positivity of the image values.

The optimum will always be local. Its distance from the global optimum is determined by the initial estimates of the arterial input function.

Frequency domain based deconvolution methods do not have the problems of spatially varying convergence rate and ringing, which cause local information losses in the spatial domain. Hence, frequency domain based deconvolution methods can recover the local information losses in the spatial domain.

The frequency domain Wiener deconvolution filter minimizes the mean-square error to the contrast signals, c(t), when the arterial input function, v(t) is known. The Wiener filter is given by $$R(\omega) = \frac{C(\omega)}{V(\omega) + \frac{\|N(\omega)\|^2}{\|R(\omega)\|^2}} \quad (18)$$

In a statistical formulation, the algorithm maximizes the posterior probability of the tissue residue function when the noise is Gaussian distributed.

As seen from Eq. (18), although the estimation of the tissue residue function is wanted, the power spectrum of this function itself is needed for this purpose. This makes the construction of the optimum filter difficult and sensitive to noise. However, by first using the Richardson-Lucy deconvolution method to obtain an estimate of the tissue residue function, the Wiener filter can be constructed much more reliably and with less noise sensitivity.

These two algorithms are used sequentially in an iterative loop. First, both the tissue residue function and the arterial input function are initialized using complex cepstrum analysis or to constant values greater than zero. Then the tissue residue function is estimated, using the Richardson-Lucy algorithm. Secondly, this estimate is used to find a new estimate of the arterial input function with the same algorithm:

$$r_{j+1}(x) = \left\{\left[\frac{c(x)}{r_j(x) * v_j(x)}\right] * v_j(-x)\right\} r_j(x) \quad (19)$$

$$v_{j+1}(x) = \left\{\left[\frac{c(x)}{v_j(x) * r_{j+1}(x)}\right] * r_{j+1}(-x)\right\} v_j(x) \quad (20)$$

Then, the Wiener deconvolution filter is used to find a new estimate of the tissue residue function and so forth. Finally, the loop is finished by finding a new estimate of the arterial input function using the Wiener deconvolution filter. The previous estimate of the arterial input function or the tissue residue function is used when the Wiener filter is computed.

$$R_{j+2}(\omega) = \frac{C(\omega)}{V_{j+1}(\omega) + \frac{\|N(\omega)\|^2}{\|R_{j+1}(\omega)\|^2}} \quad (21)$$

$$V_{j+2}(\omega) = \frac{C(\omega)}{R_{j+2}(\omega) + \frac{\|N(\omega)\|^2}{\|V_{j+1}(\omega)\|^2}} \quad (22)$$

Typically, the iterations are ended after about 6 iterations.

In a preferred embodiment of the method of the invention, account is taken of leakage of contrast agent from the vasculature and of contrast agent recirculation effects. For organs and tissues other than the brain, there is considerable contrast agent leakage where a conventional ECF-distributing contrast agent, e.g. GdDTPA, is used. Moreover, even in brain perfusion imaging, contrast agent leakage across the blood brain barrier can occur as brain tumours may have leaky capillaries. In the preferred embodiment, leakage and recirculation effects are estimated automatically for each voxel. Their signal contributions are then removed from the measured contrast signals. The remaining signal is the first pass signal of the contrast agent. This signal is then used for automatic, iterative estimation of voxel specific arterial input functions and voxel specific tissue residue functions. Using this embodiment of the method of the invention, the Wiener filter constant is estimated automatically leaving it only necessary to define the filter in the complex cepstrum domain if used for initialization; however with the iterative calculation of the voxel specific arterial input and tissue residue functions, the exact value and shape of the complex cepstrum filter is much less important, optionally signal transformation to the complex cepstrum can be omitted.

In a further aspect of the invention, the Richardson-Lucy deconvolution is used for all blind estimates. After the first pass contrast signal has been isolated, an initial estimate for the two convolved functions is set. These estimates are either obtained through cepstrum analysis, or by setting the function values to constants larger than zero, i.e. non-negative. For the initialization, it is preferred that the total energy (the area under the curve) of the convolved contrast signal is conserved in the initialization of the tissue residue function and the arterial input function, i.e. the area of the tissue residue function scaled by flow is equal to the area of the convolved contrast signals divided by the area of the arterial input function.

In a preferred embodiment, the conservation of contrast may optionally be forced by normalising the arterial input functions to the same (unit) area, to assure that the same amount of contrast passes through all voxels.

In a further preferred embodiment, the arterial input function is restricted to the same time bins as the first pass contrast signals, i.e. time points after the pre-bolus and before those identified by the leakage model as non-first pass. The tissue residue function is restricted to the first time points.

In a preferred embodiment, the maximum likelihood formulation with Poisson noise, as used in the Richardson-Lucy algorithm, can be improved by using a Maximum Aposteriori Probability (MAP) solution, see, for example, the Poisson Bayes model (Stark et al, "Deconvolution in Astronomy: A review", Publications of the Astronomical Society of the Pacific, Vol 114, 1051-1069 (2002). This and all other citations mentioned in any part of this application are hereby incorporated herein by reference.

The Poisson Bayes model is given below:

$$r_{j+1}(x) = r_j(x)\exp\left[\left(\frac{c(x)}{v(x) * r_j(x)} - 1 * v^*(x)\right)\right] \quad (23)$$

In a another preferred embodiment, to reduce noise, the Richardson-Lucy algorithm may also be regularised using the following formula:

$$r_{j+1}(x) = r_j(x) \left( \frac{c_j(x) + \overline{R}_j(x)}{c_j(x)} * v^*(x) \right) \quad (24)$$

wherein $c_j(x) = v(x) * r_j(x)$ and $R_j(x) = c(x) - c_j(x)$.

Thereafter, iterations are started by first improving the estimate of the arterial input function. This may be done by initializing the arterial input function to the normalized convoled contrast concentration. This estimate is used to improve the estimate of the tissue residue function and so forth. Richardson-Lucy deconvolution is used in each iteration. Either function is updated iteratively to a local optimum. Typically, the iterations are ended after about 6 iterations.

A computer software product for use in implementation of the invention may be provided in the form of a physical carrier such as a disk, tape or other memory device, or may be provided as signals transmitted from a remote location, for example over a network such as the Internet.

The invention will now be described with reference to the following Examples and the accompanying drawings in which.

Figure 6:
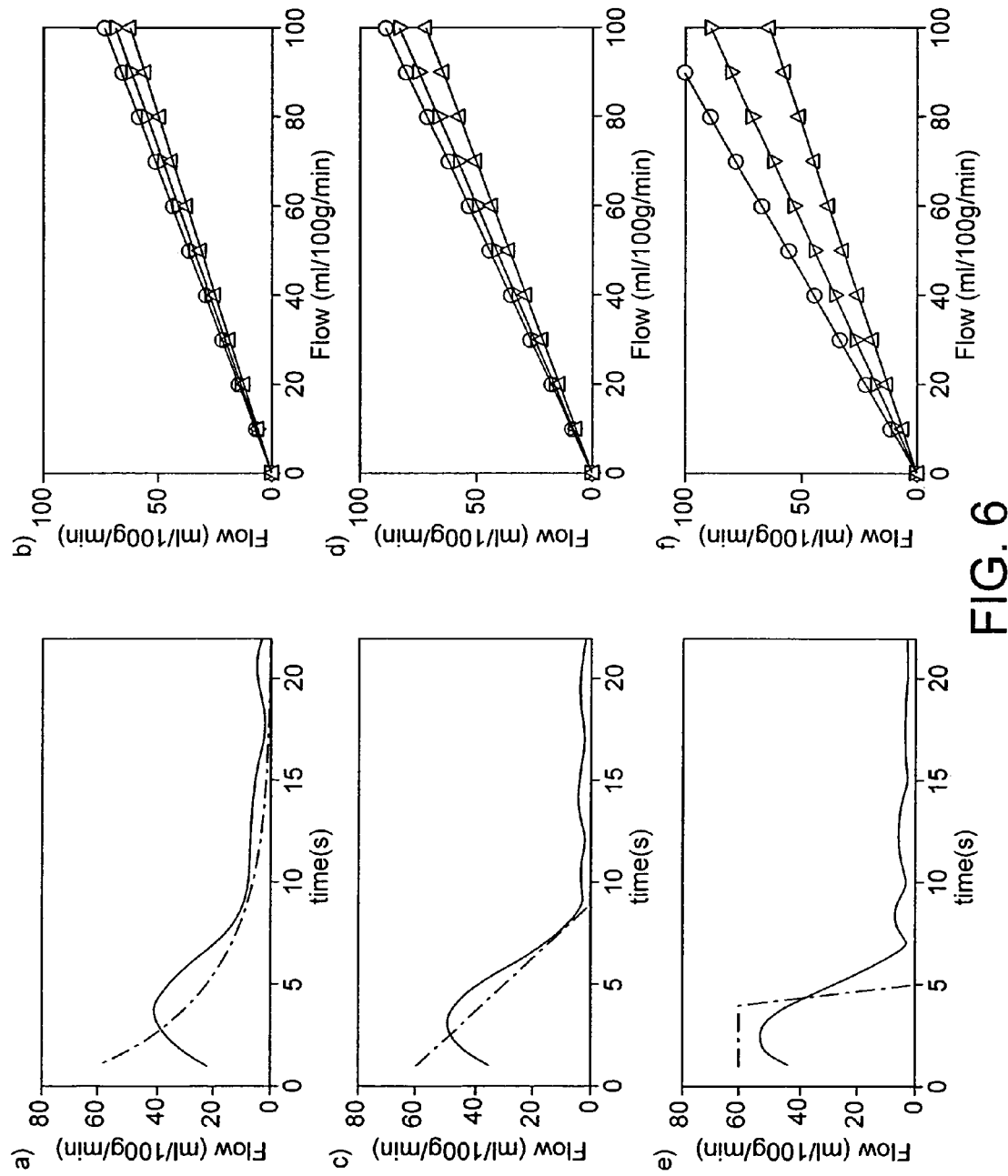
Figure 7:
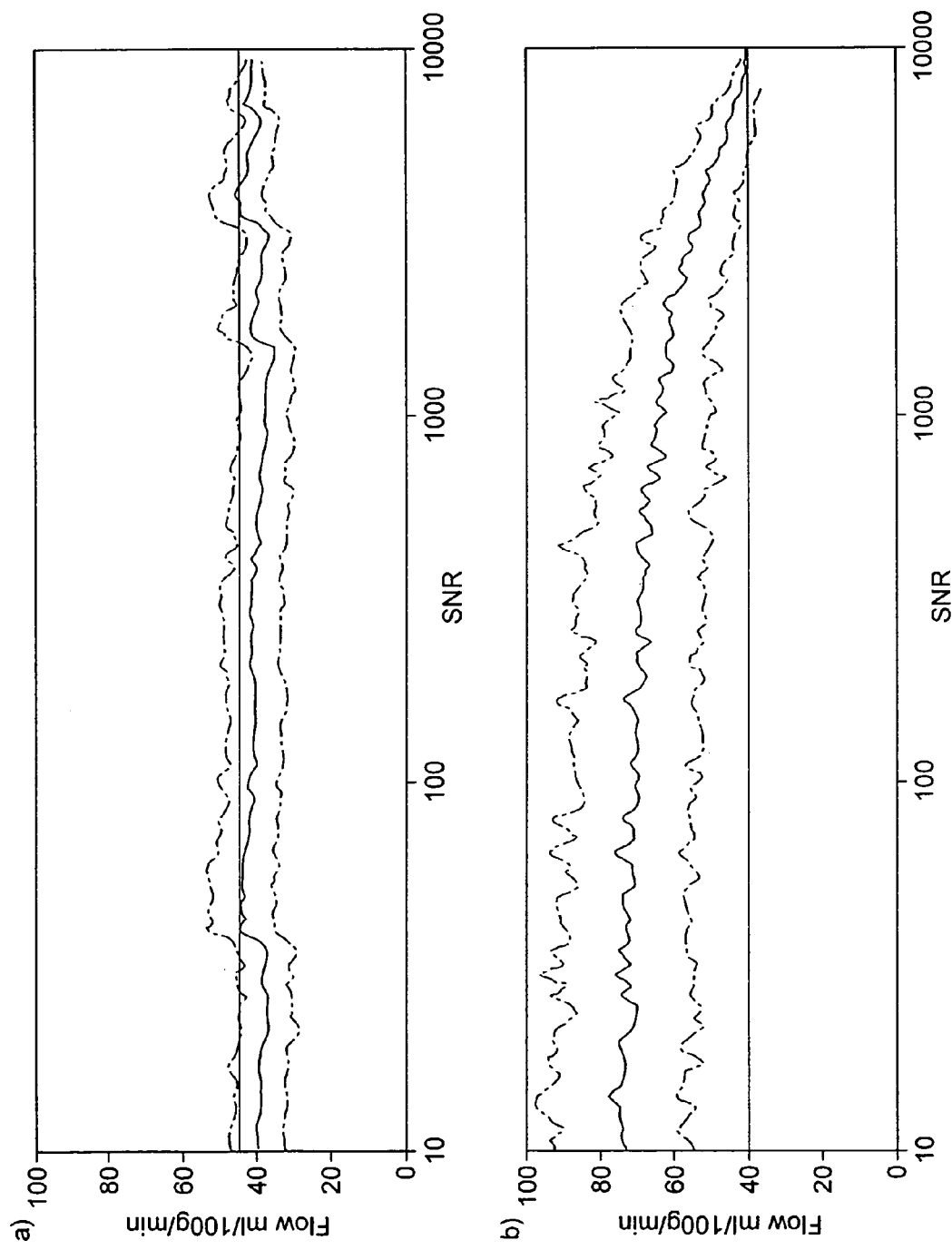
Figure 8:
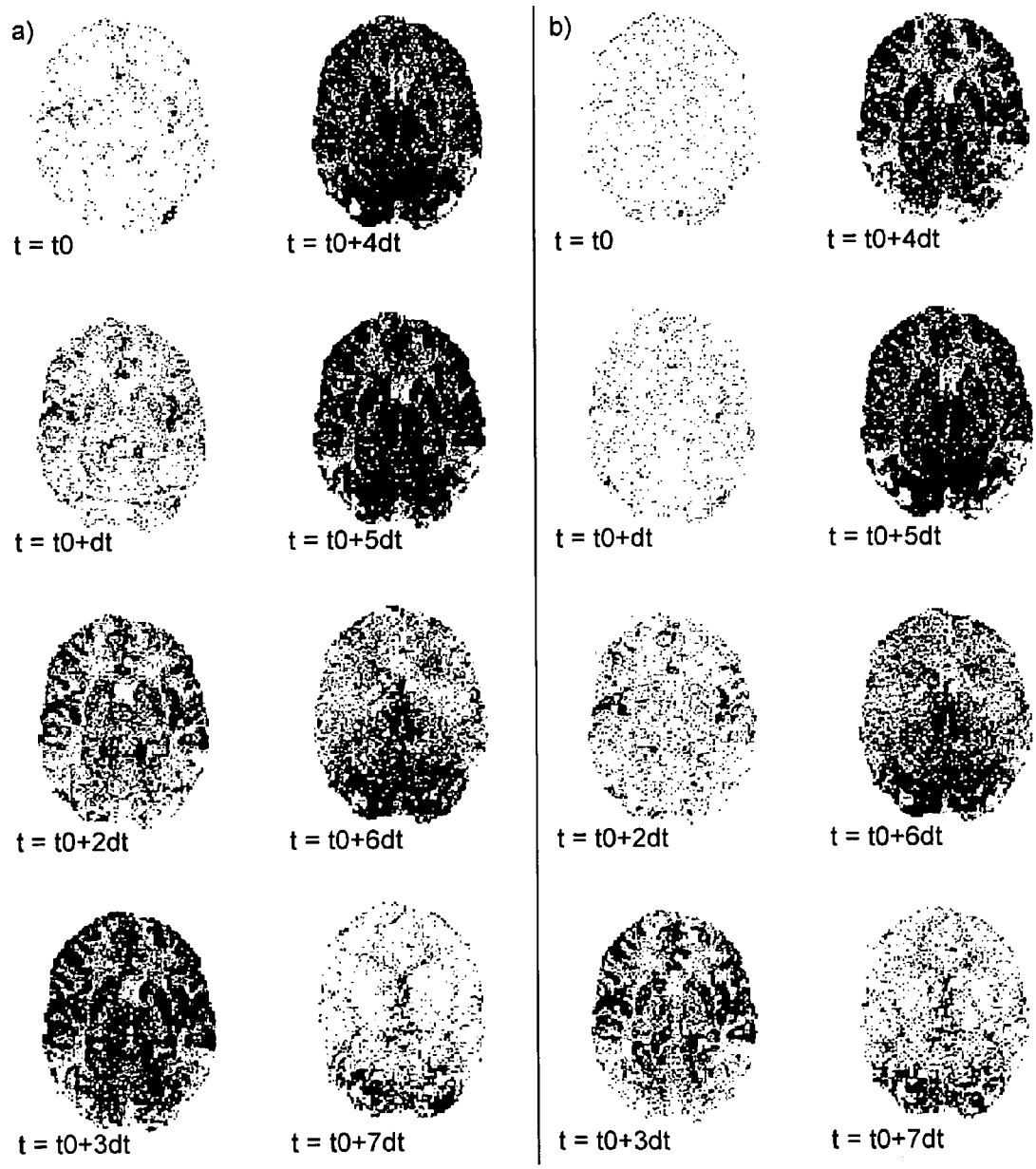
Figure 9:
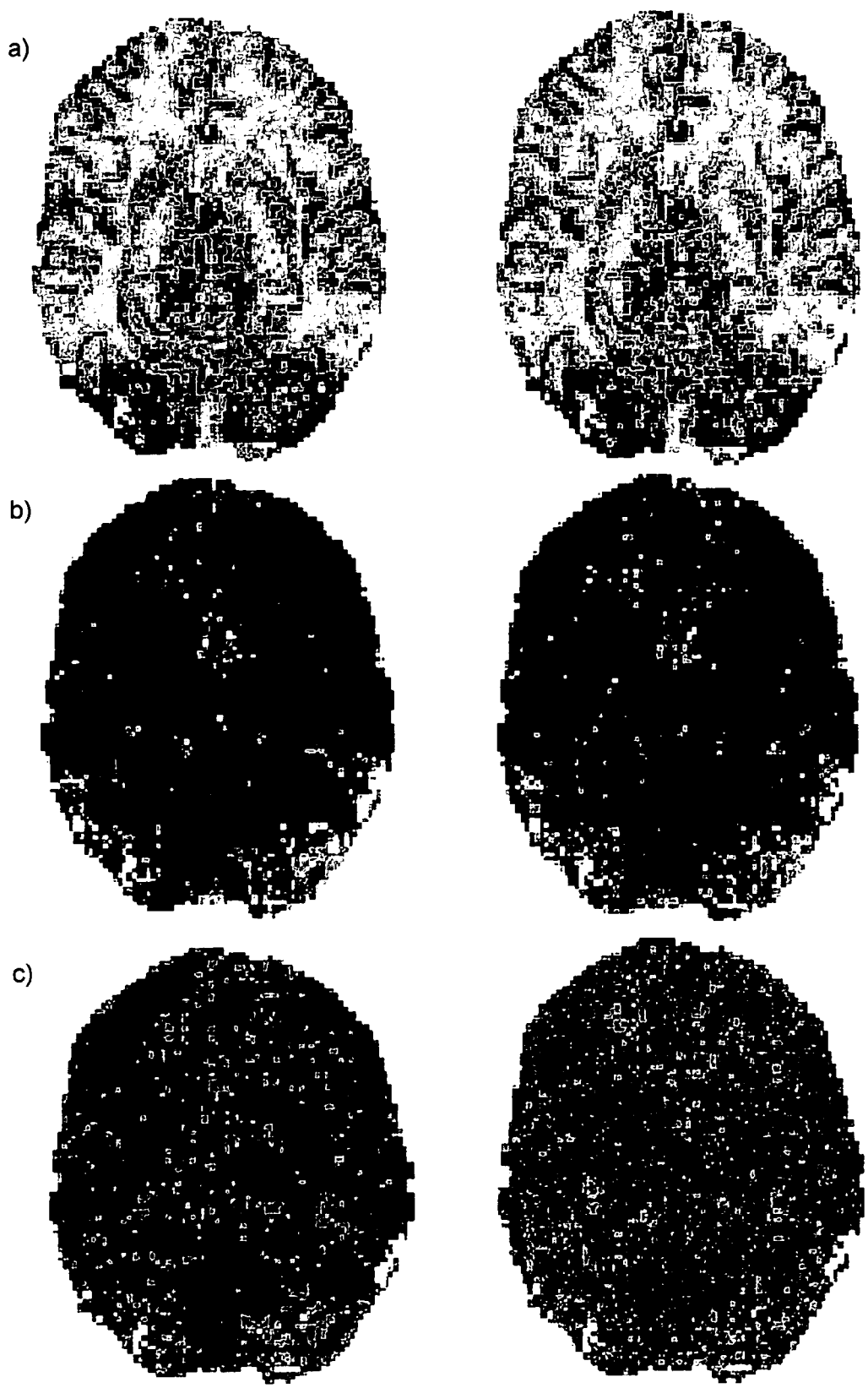
Figure 10:
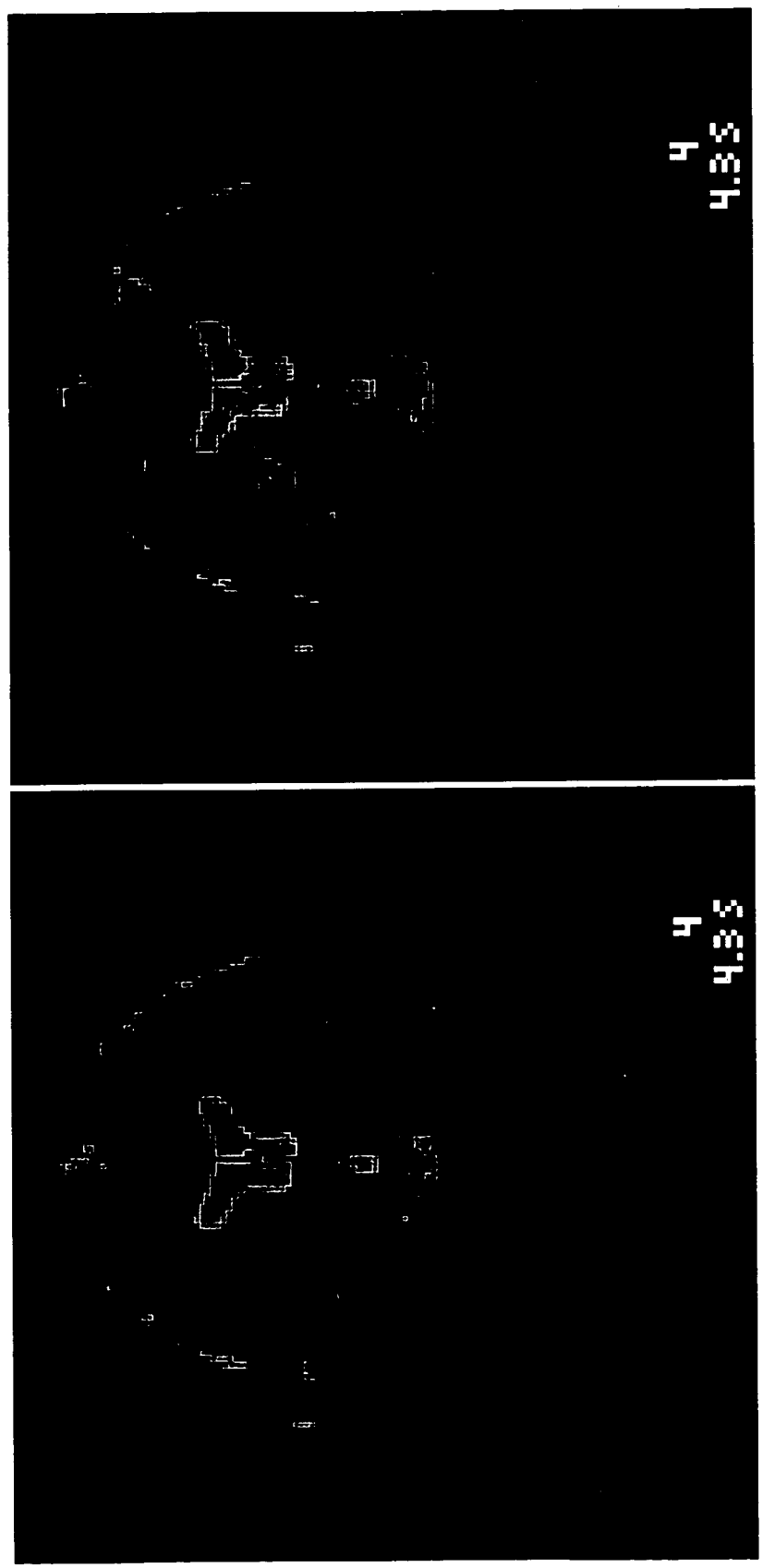
Figure 11:
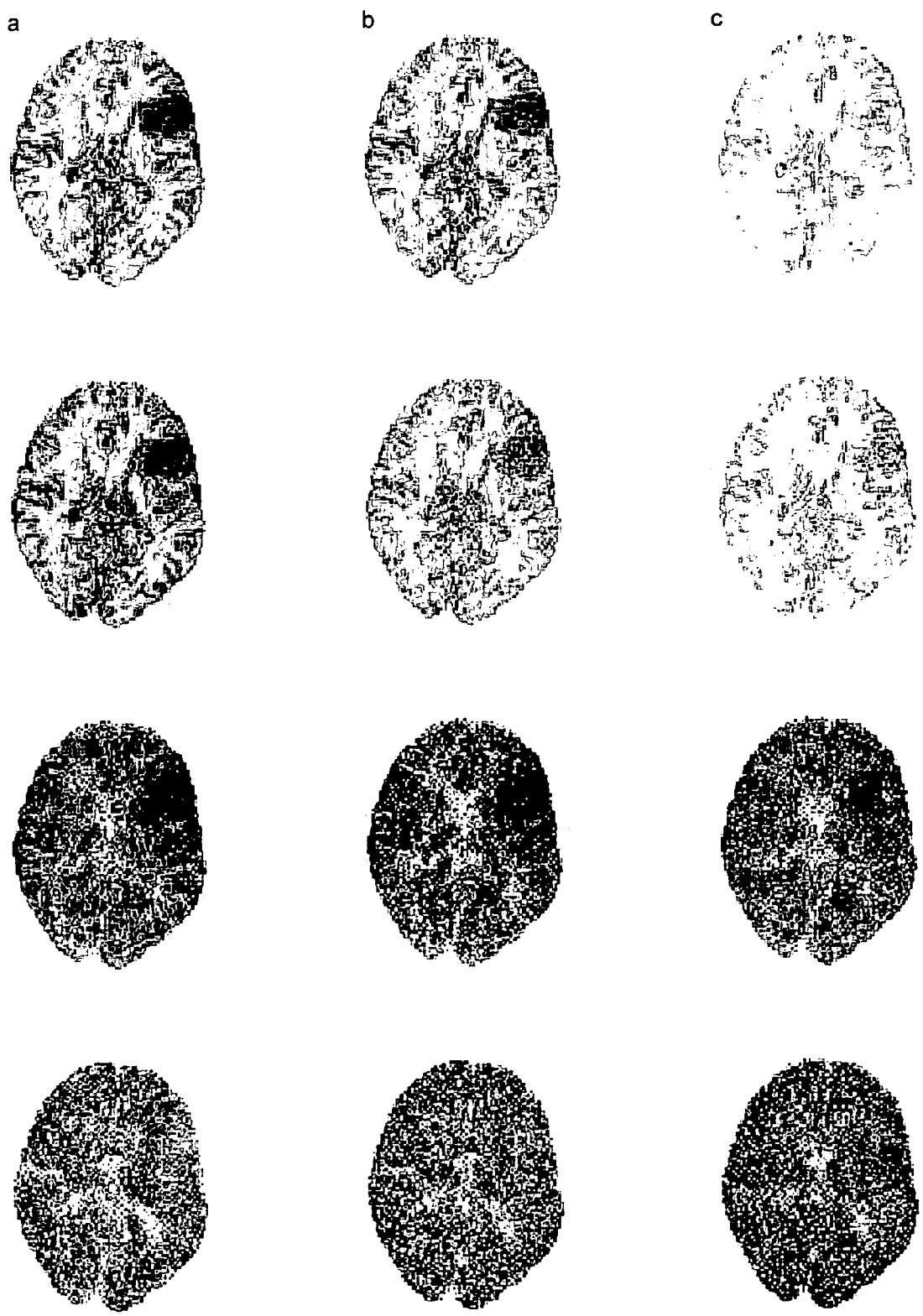
Figure 12:
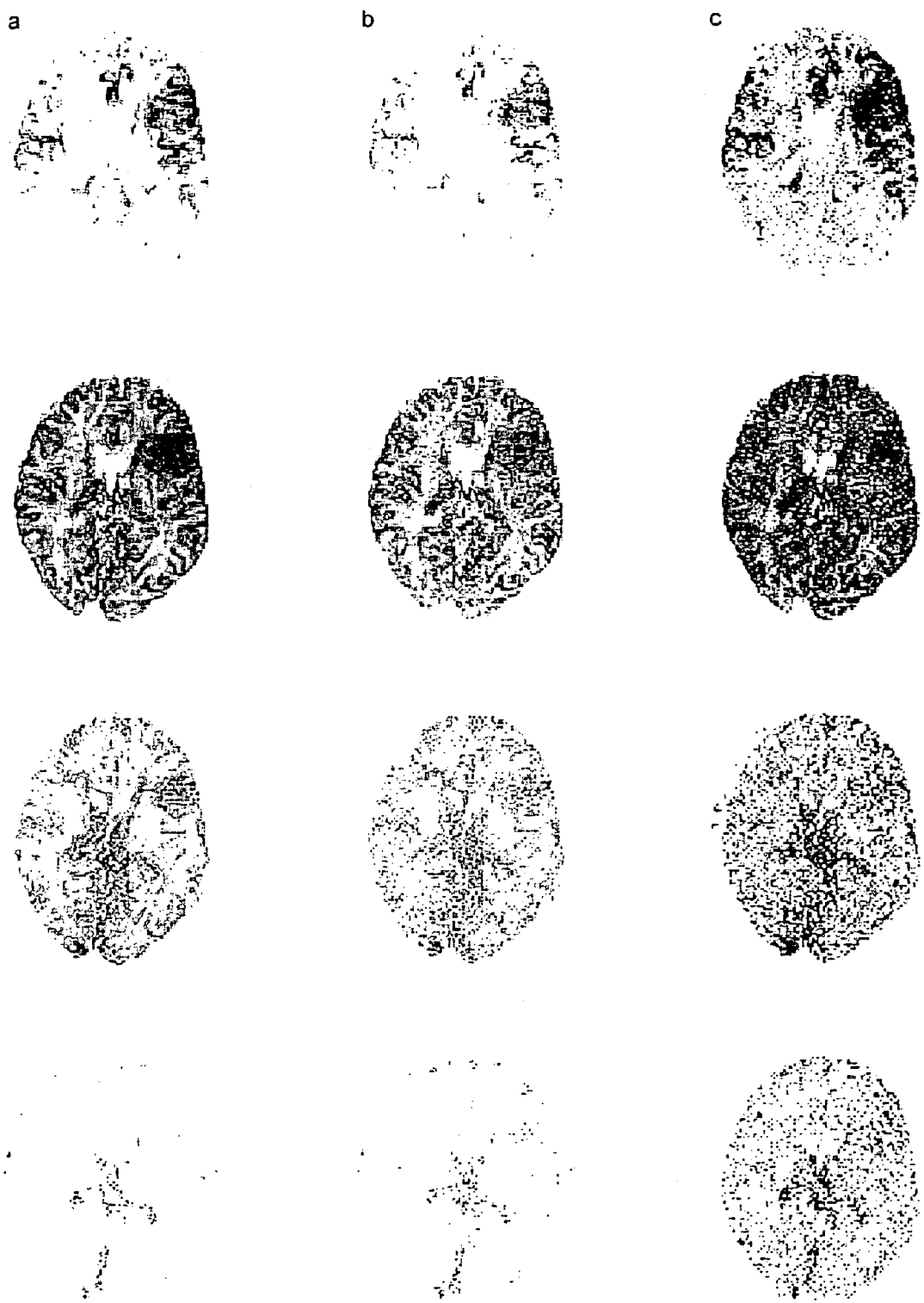
Figure 13:
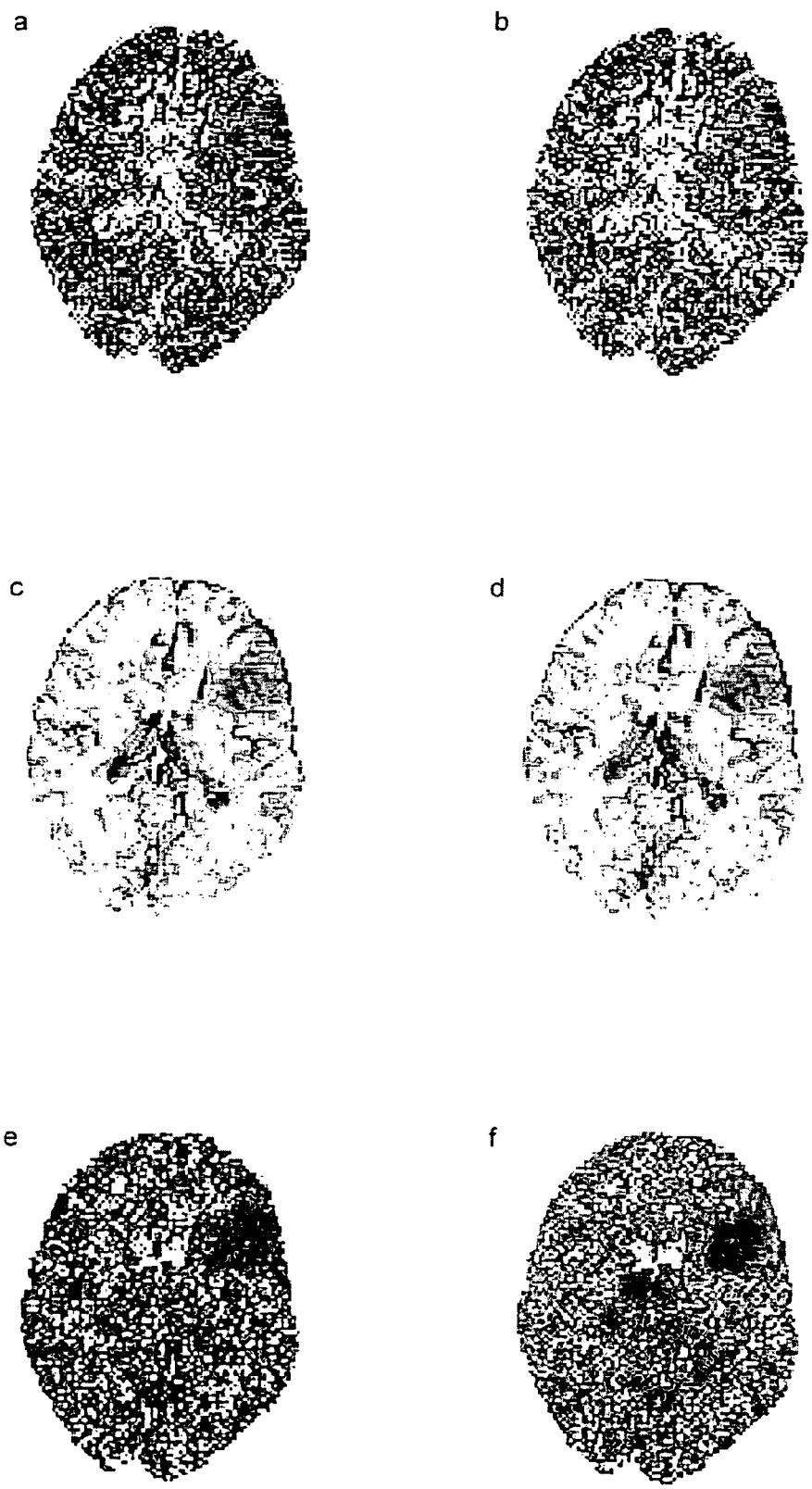

FIG. 6 is a plot of shape and initial height (flow) of deconvolved contrast concentration functions with no noise (Tissue residue functions with exponential shape ((a) and (b)), triangular shape ((c) and (d)), and box-shape. Left column; deconvolved (solid line) and initial (dashed-dotted line) concentration functions (F=60 ml/100 g/min, MTT=4 s). Right column; computed flow values (mean±standard deviation) for increased input flow values with MTT of 3 s (○), 4S (∉), 5 s (∈));

FIG. 7 is a plot of estimated flow with decreasing Signal-to-noise ratios (Mean value (solid line) and standard deviation (dashed line) of fifty voxels a) when repeatedly optimizing the Wiener filter constant and b) with a non varying Wiener filter constant, q=0.01);

FIG. 8 shows images of in vivo deconvolved contrast concentrations as a function of time (changes in signal intensity in a selection of eight time point measurements after deconvolving each voxel with a) in-slice, manually selected arterial input function, b) blind estimated, voxel specific arterial input function);

FIG. 9 shows images of cerebral blood flow (upper row), time-to-peak (middle row) and mean transit time (lower row) (Manual selected arterial input functions (left) Blind estimated arterial input functions (right). Darker values in flow images represent voxels with high flow, while darker values in time-to-peak and mean transit time images represent shorter times);

FIG. 10 shows images of tissue label masks (a) Precontrast perfusion image. b). Tissue label masks superimposed on same image. White matter; black masks just above the lateral ventricles. Grey Matter; the six remaining black masks. The two most frontal mask; cortical grey substance. The two masks just posterior to the side ventricles; caput nucleus caudatus. The two most posterior masks; nucleus lentiformis);

FIG. 11 shows parametric perfusion images (Darkness increase linearly with volume and flow. Brightness increase linearly with time. Time to peak and mean transit time images linearly scaled to show relevant image features. a) Complete model with recirculation, leakage and improved estimates of arterial input functions. b) Complete model with recirculation, leakage and complex cepstrum estimates of arterial input functions. c) Model with no recirculation and no leakage and complex cepstrum estimates of arterial input functions. First line: Blood volume. Second line: Blood flow. Third line: Mean transit time. Fourth line: Time of delay);

FIG. 12 shows the time course of tissue residue function (Darkness increase linearly with flow. a) Complete model with recirculation, leakage and improved estimates of arterial input functions. b) Complete model with recirculation, leakage and complex cepstrum estimates of arterial input functions. c) Model with no recirculation and no leakage and complex cepstrum estimates of arterial input functions. Line one: frame 18. Line two: frame 20. Line two: frame 23. Line two: frame 26); and FIG. 13 shows leakage and recirculation images (Darkness increase linearly with leakage volume. Brightness increase linearly with size of leakage coefficient and with time. All images linearly scaled to show relevant image features. Leakage coefficients larger than 0.1 set to 0.1. First line, leakage coefficient images. Second line, steady state contrast signal images. Third line, recirculation time images. a, c) Complete model with recirculation, leakage and improved estimates of arterial input functions. b, d) Model with leakage and improved estimates of arterial input functions, but no recirculation term. e) Complete model with recirculation, leakage and improved estimates of arterial input functions. f) Model with recirculation and improved estimates of arterial input functions, but no leakage term).

Figure 14:
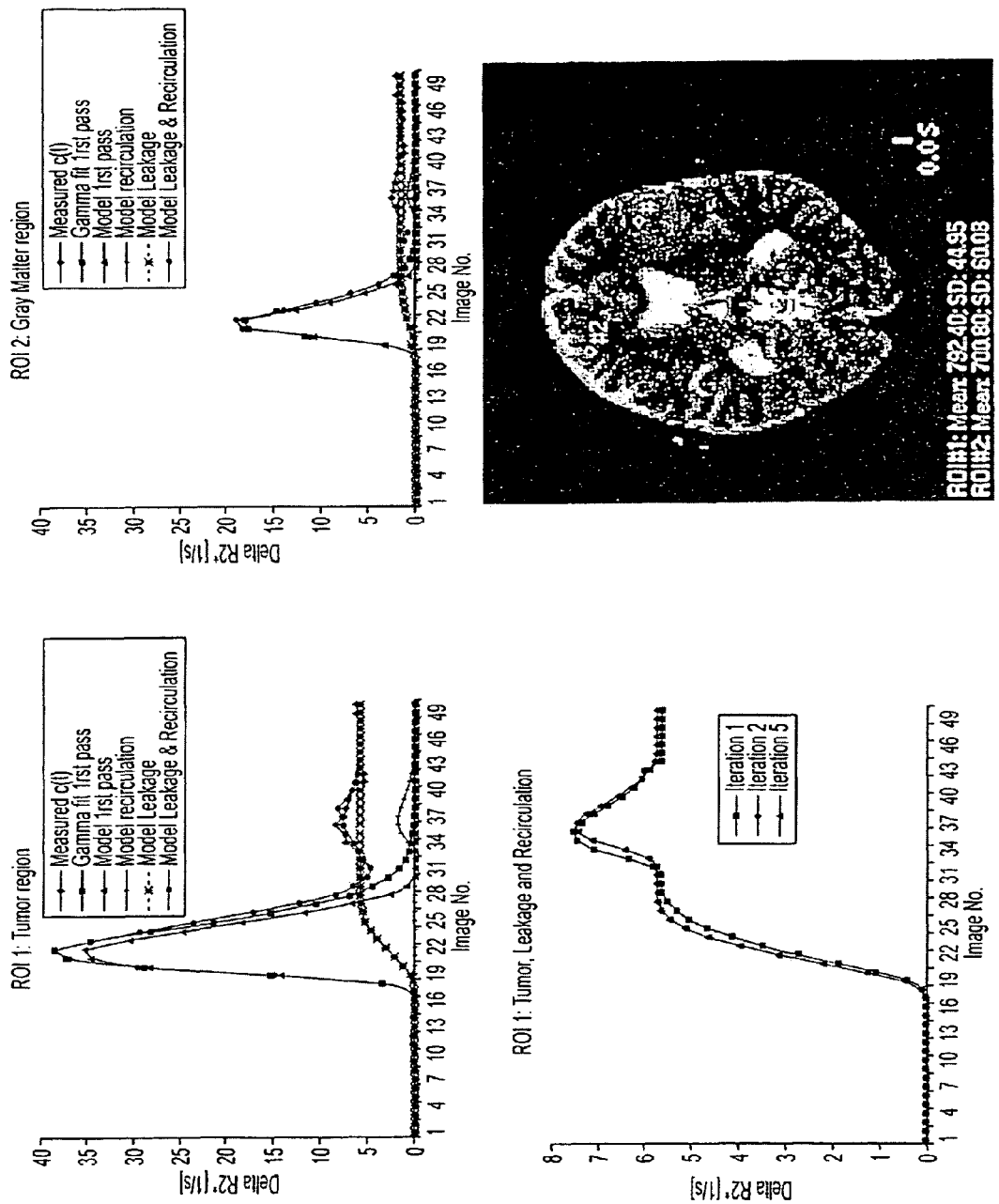

FIG. 14 shows modeling of leakage and recirculation. Selected regions of interest in data from tumor patient: a) results in tumor area, b) results in cortical gray matter, c) convergence properties for combined recirculation and leakage function in tumor area, d) regions-of-interests superimposed on the first image in the perfusion time series.

Figure 15:
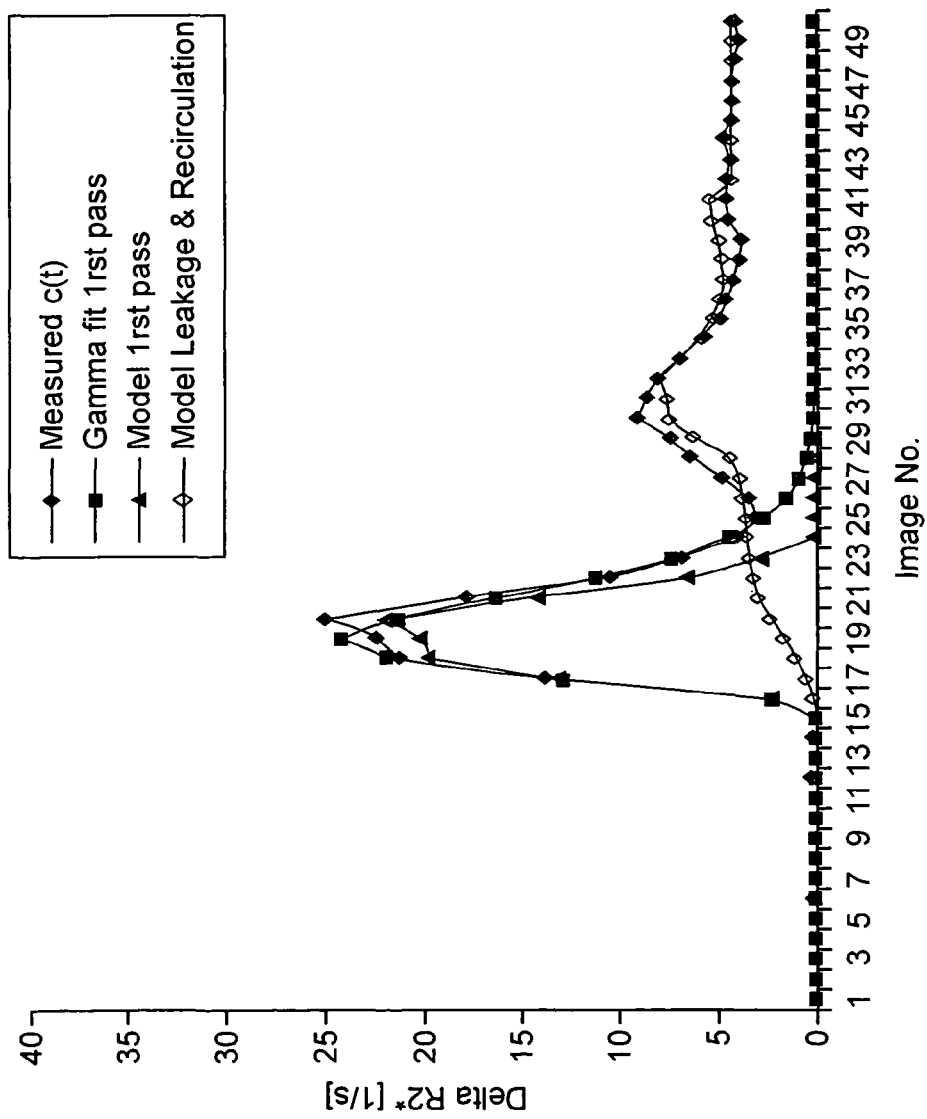

FIG. 15 shows modeling of leakage and recirculation. Selected region-of-interest in healthy gray matter in data from patient with fibromuscular dysplasia.

Figure 16:
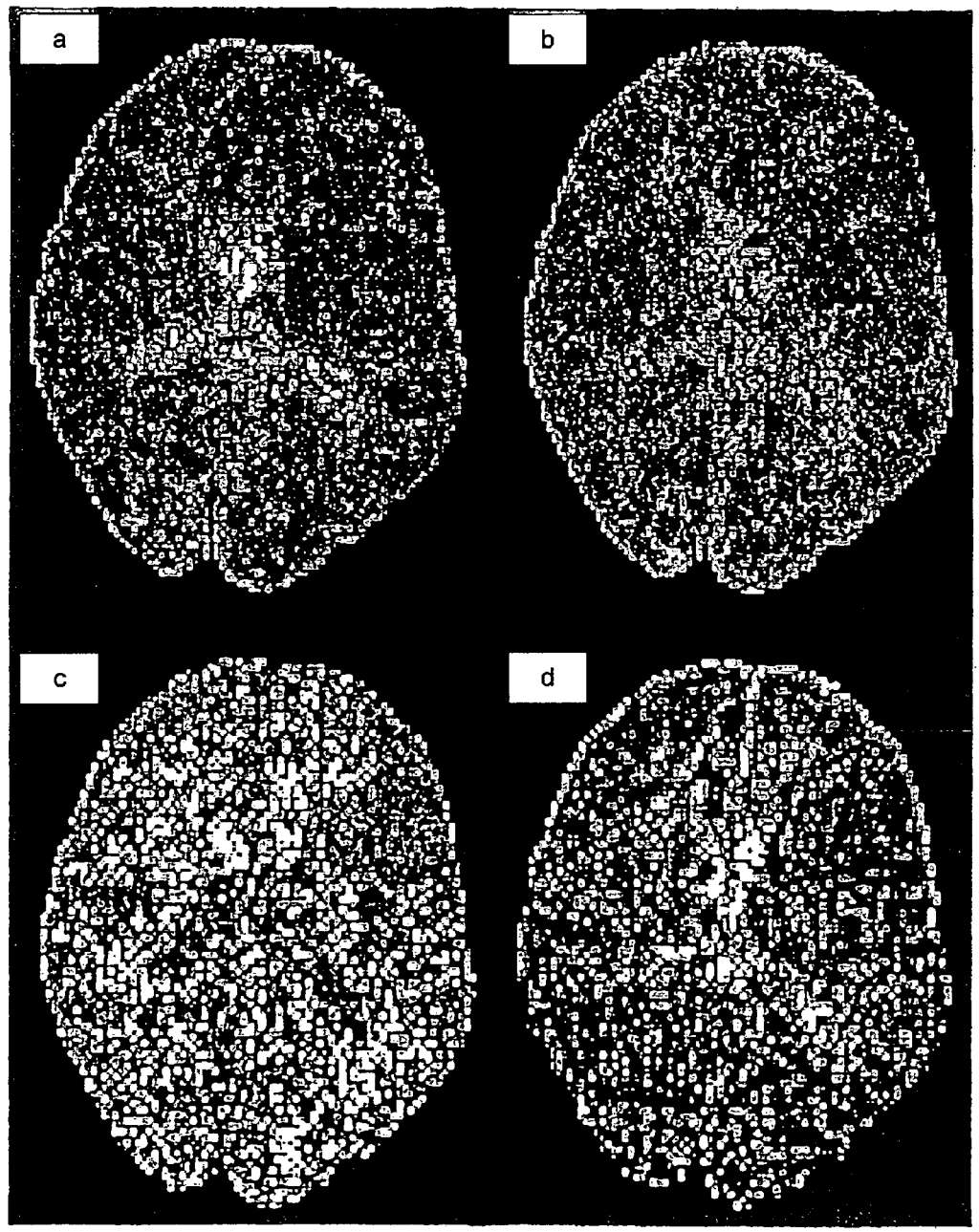

FIG. 16 shows time-to-peak, estimated leakage and recirculation parameters. a) Relative time-to-peak (rTTP) i.e. the time-to-peak of the convolved contrast signals, b) Absolute time-to-peak (TTP) i.e. time-to-peak after deconvolution (here iterative blind deconvolution) c) Ti, i.e. the time-to-peak of the second pass, d) leakage parameter, $\kappa_i$. Brighter values are larger than darker values.

Figure 17:
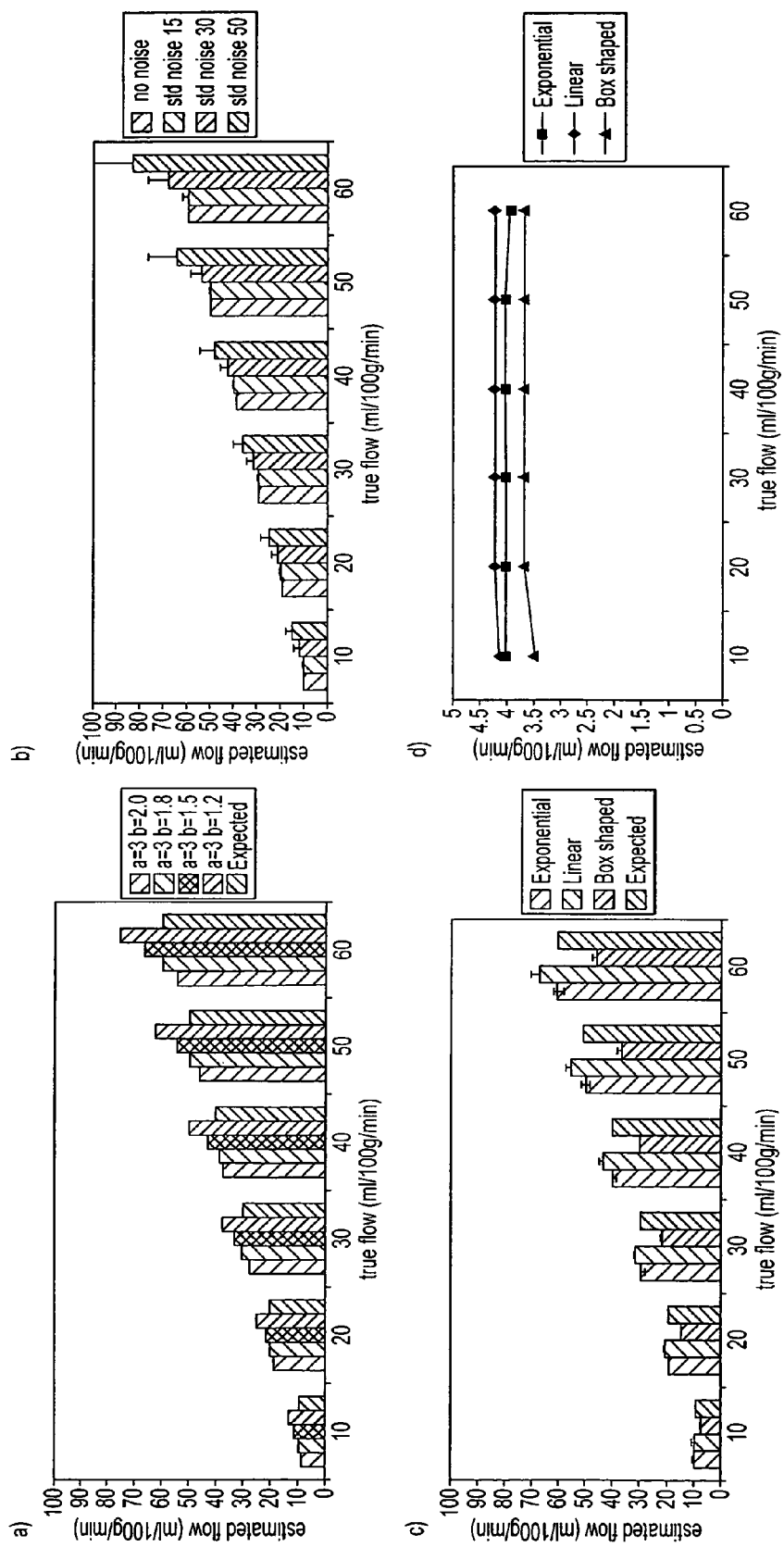

FIG. 17 shows the results of the computer simulations. Estimated flow values when varying a) the arterial input functions but with fixed tissue residue function (exponential with MTT=4 s), b) the noise conditions for fixed arterial input function (a=3, b=1.8) and fixed tissue residue function (exponential with MTT=4 s), c) the shape of the tissue residue function but fixed arterial input function (a=3, b=1.8). The reproduced mean transit times using different shaped tissue residue functions (with input mean transit time 4 s) is shown in d.

Figure 18:
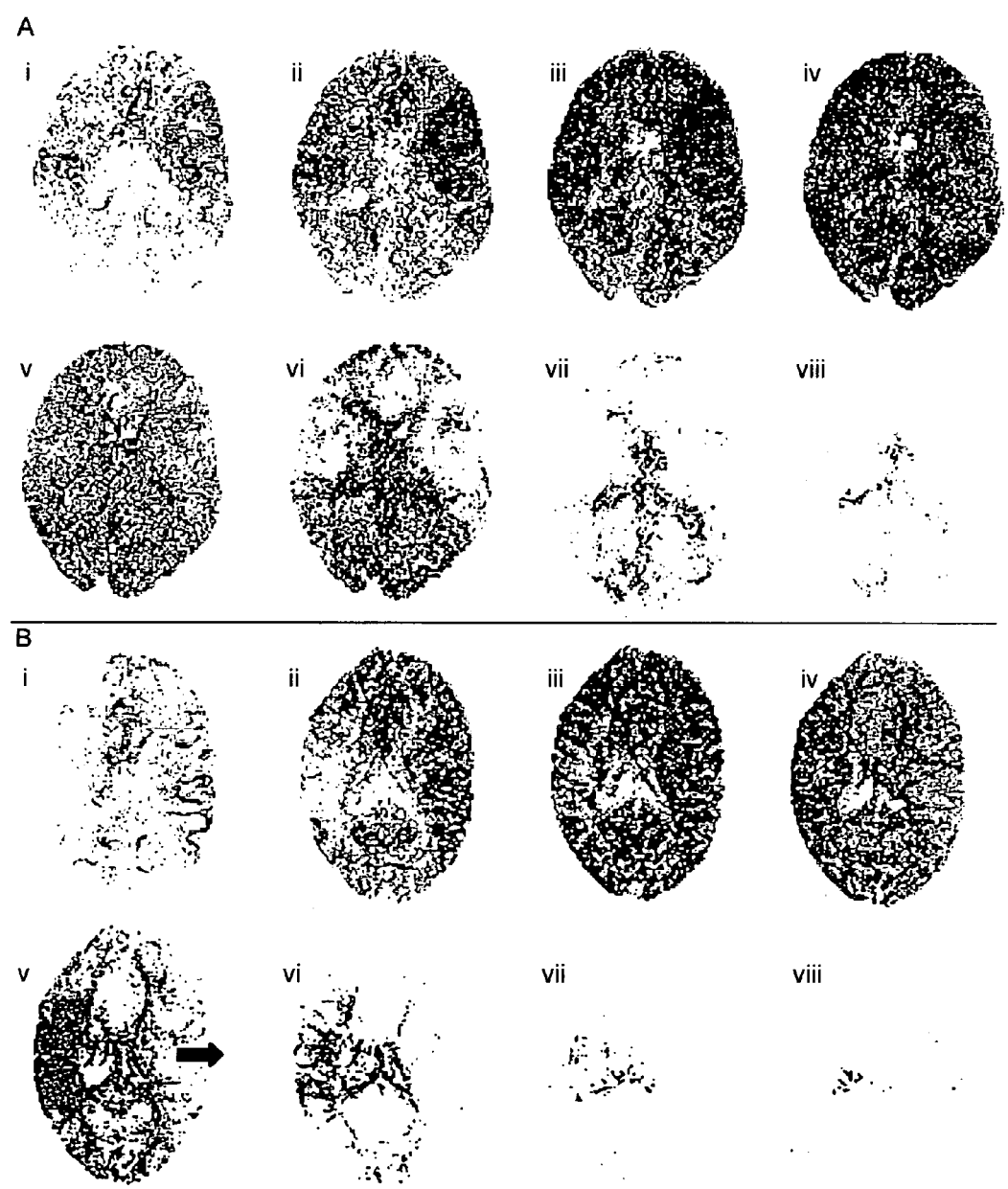

FIG. 18 shows in vivo arterial input functions. Time difference between image frames is TR=1.442 seconds. Higher values are dark. A) Left frontal lobe tumor. B) Right middle cerebral fibromuscular dysplasia.

Figure 19:
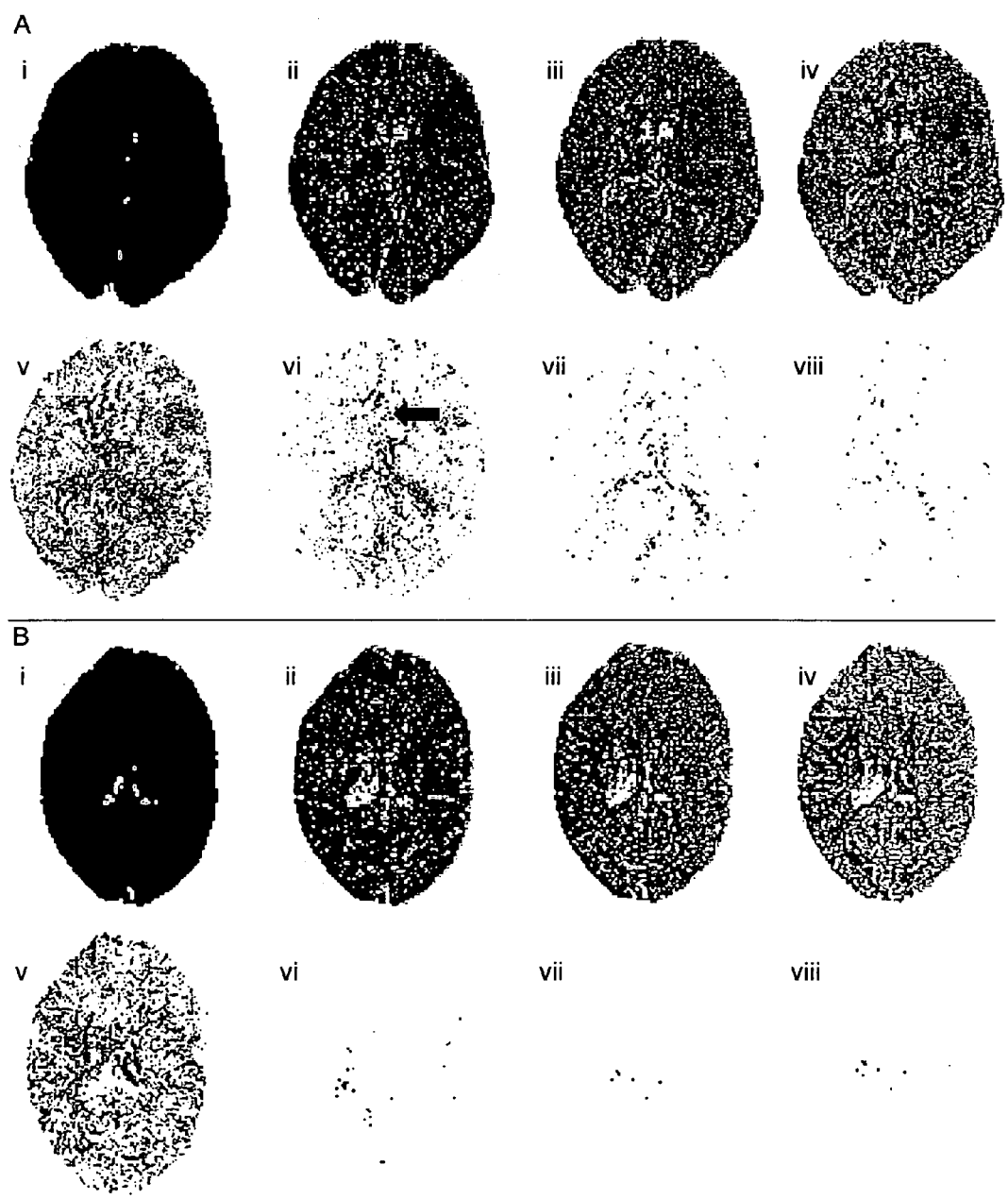
Figure 20A:
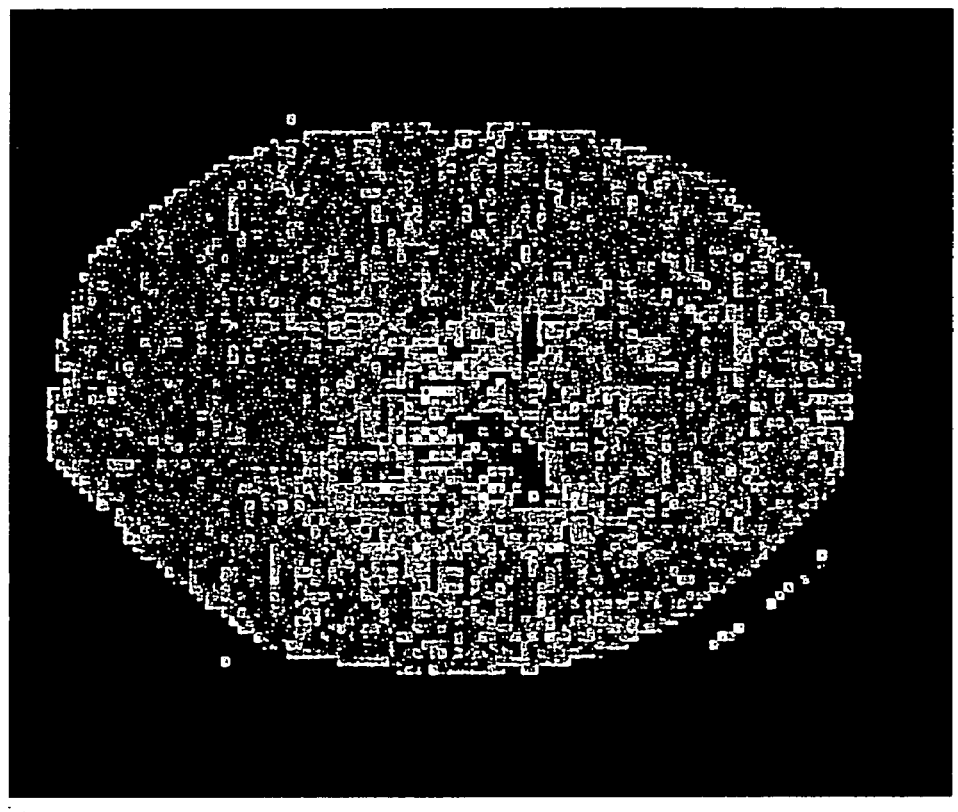
Figure 20B:
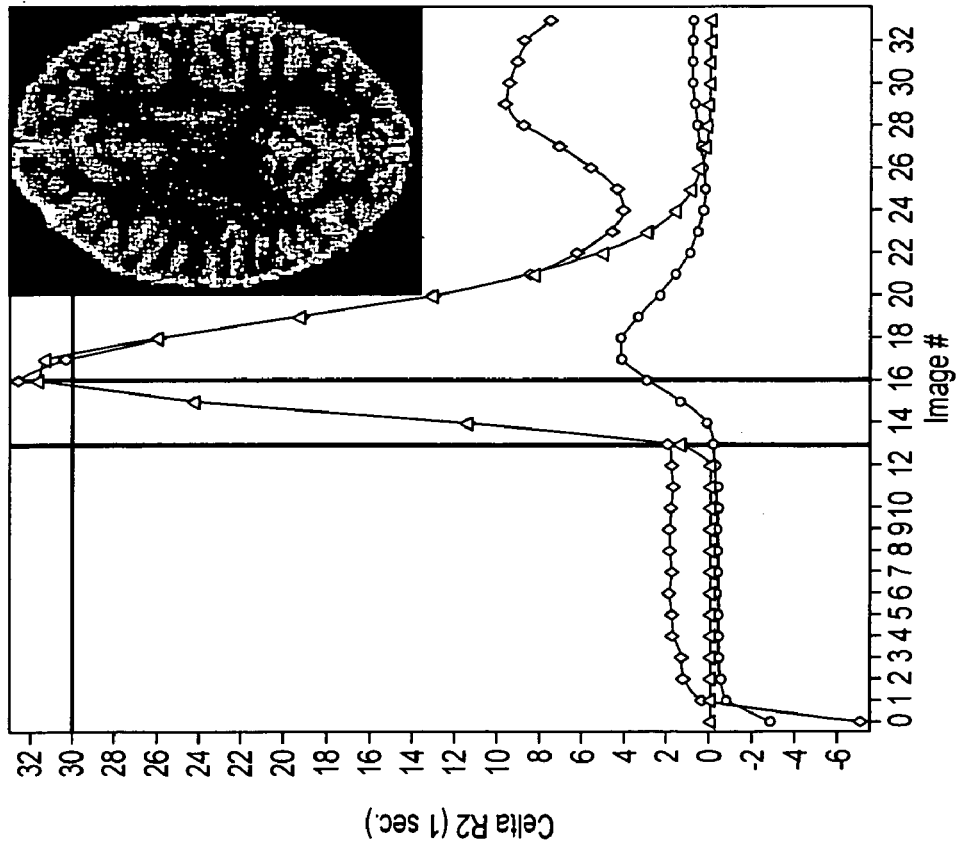
Figure 20D:
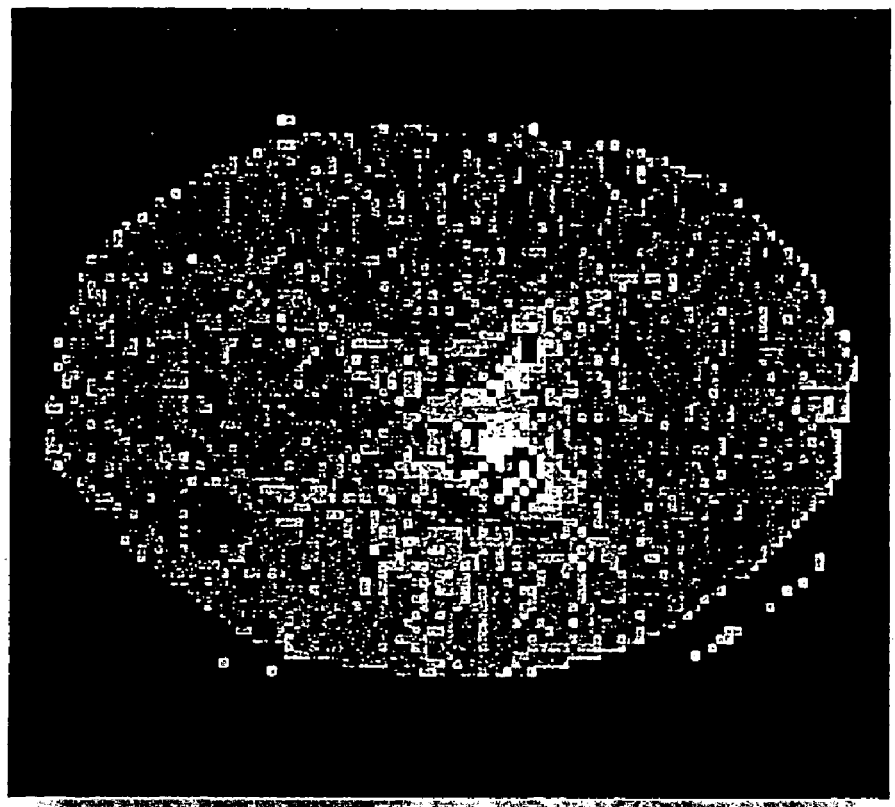
Figure 20C:
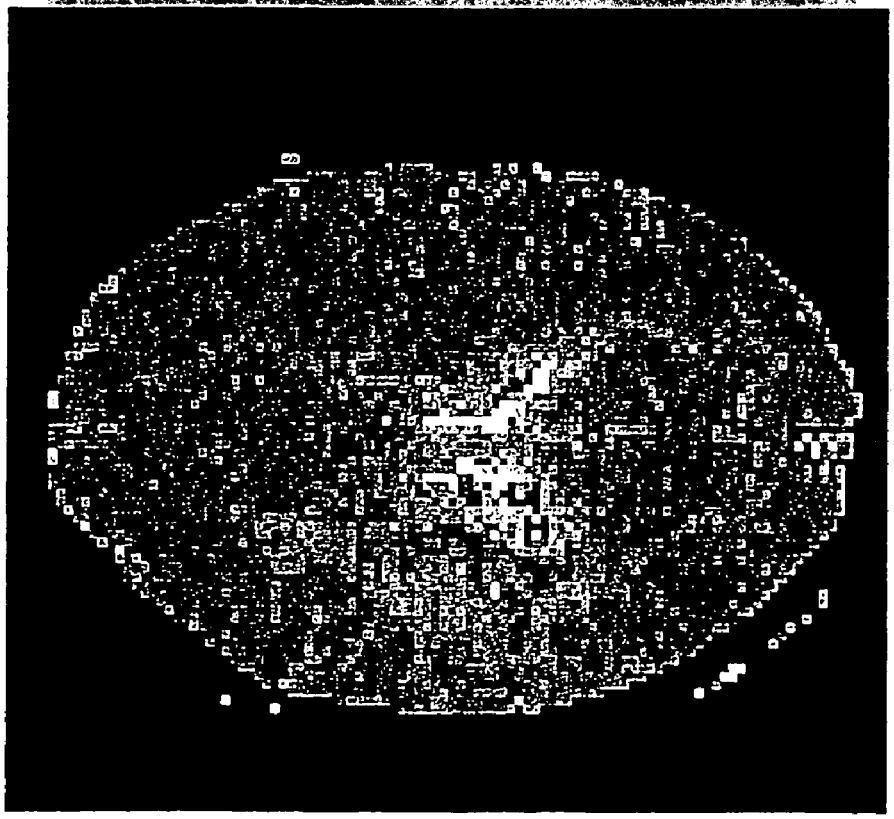

FIG. 19 shows in vivo Tissue Residue Functions. Time difference between image frames is TR=1.442 seconds. The first time bin is the maximum value of the tissue residue function, r(t)=1. Smaller values are brighter in colors. A) Left frontal lobe tumor. B) Right middle cerebral fibromuscular dysplasia.

FIG. 20 shows in vivo analysis of a patient with right middle cerebral artery fibromuscular dysplasia. a) Selection of arterial input function as the voxels with the earliest and largest signal change (the upper darker curve), and subsequently gamma fitting (the lighter curve). Seven voxels were selected (the highlighted voxels in the smaller image), b) Mean transit time proposed method, c) Time-to-peak conventional method d) Time-to-peak proposed method. Darker values represent shorter times.

Figure 21:
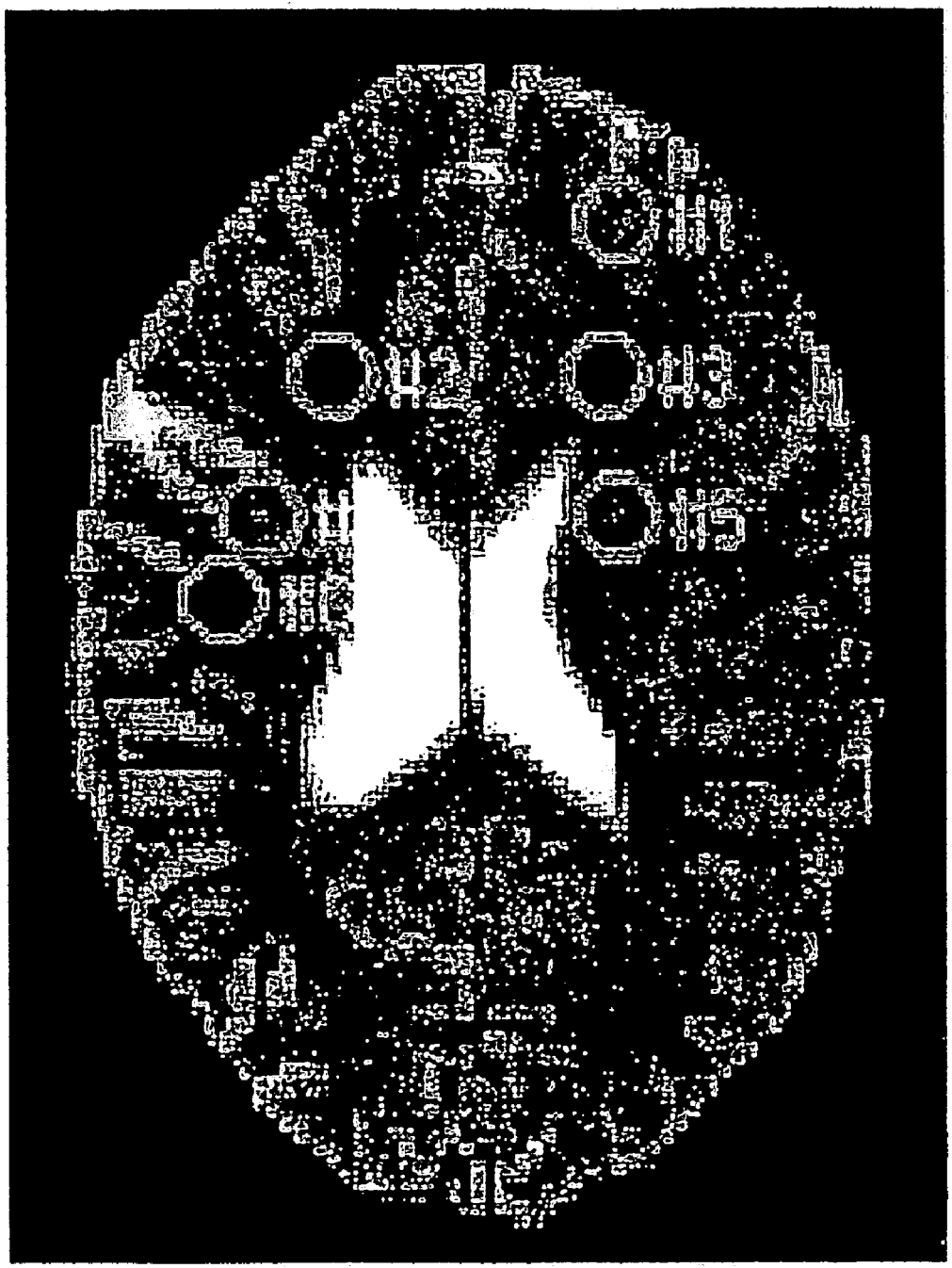

FIG. 21 Region-of-interests. Patient with right middle cerebral artery fibromuscular dysplasia. Mean values of MTT and TTP shown in Table 12.

EXAMPLE 1

Simulations

Synthetic data were generated following the description in Calamante et al. MRM 44: 466-473 (2000) and Østergaard et al. MRM 36: 715-725 (1996). Parameters were adjusted to mimic data acquired during a typical, in vivo perfusion study. In each case, a time series containing fifty images was generated. Since the time evolution of each voxel is treated separately in the algorithm described, the synthetic data were often divided into different spatial segments, each representing either different physical (i.e. noise) or physiological (i.e. tissue properties) conditions. In all evaluations, flow is set to the maximum value of the deconvolved contrast concentration curves, while the elapsed time before the occurrence of this maximum value gives time-to-peak.

Both the arterial input function and the tissue residue function had to be modelled. A gamma variate function was used to simulate the arterial input function.

$$v_i(t) = \begin{cases} 0 & \text{if } t < t_{0i} \\ (t-t_{0i})^a e^{(t-t_{0i})/b} & \text{if } t \geq t_{0i} \end{cases}$$

where $t_{0i}$ is the time of bolus occurrence in the voxel (i) of interest, and a and b are model dependent parameters. The tissue residue function, $r_i(t)$, was in general modelled as an exponentially decaying function. When multiplied with the tissue flow, $F_i$ it can be expressed as $$u_i(t) = F_i \cdot r_i(t) = F_i \cdot e^{-t/MTT_i} \quad (25)$$

where $MTT_i$ represents the corresponding mean transit time through the voxel of interest.

The convolution between $u_i(t)$ and $v_i(t)$ was obtained by a simple multiplication in Fourier domain, $$c_i(t) = \mathcal{F}^{-1}[\mathcal{F}[v_i(t)] \cdot \mathcal{F}[u_i(t)]] \quad (26)$$

where $\mathcal{F}$ and $\mathcal{F}^{-1}$ represent the Fourier transform and its inverse. As this approach might be affected by the ringing artifacts of the finite, discrete Fourier transform, comparison to the analytical expressions in Calamante et al (supra) was performed.

The contrast concentration curves, c(t), in Eq. (26) were subsequently converted to signal-time curves. The baseline signal intensity was set to $s_i(0)=600$ MR units. To obtain realistic noise distributions, a part of a data set outside object boundaries was extracted from a clinical perfusion measurement. These fifty time frame measurements (64×64 pixels) with noise were added to the synthetic data sets after removal of the mean noise value.

Figure 1:
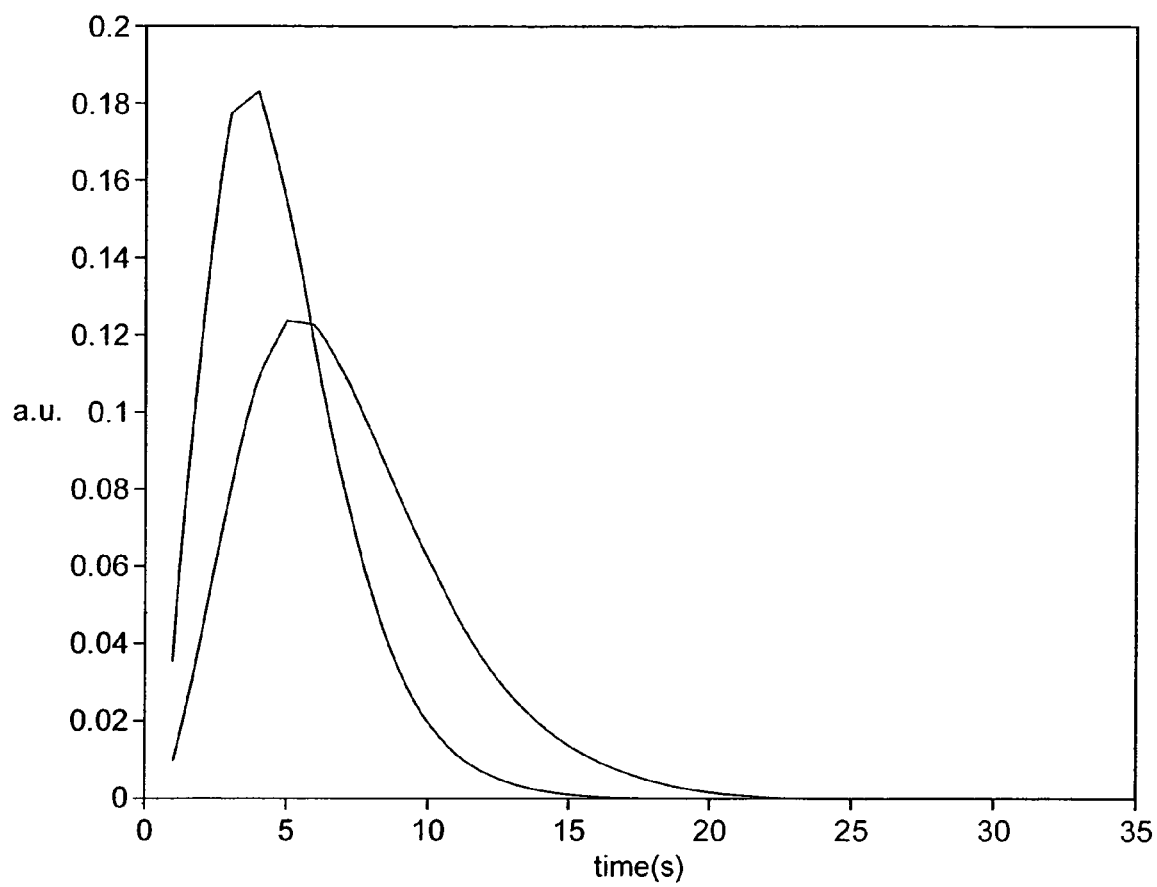
FIG. 1 is a plot of two arterial input functions $v_i(t)$ against time simulating the effects of dispersion.
Figure 2:
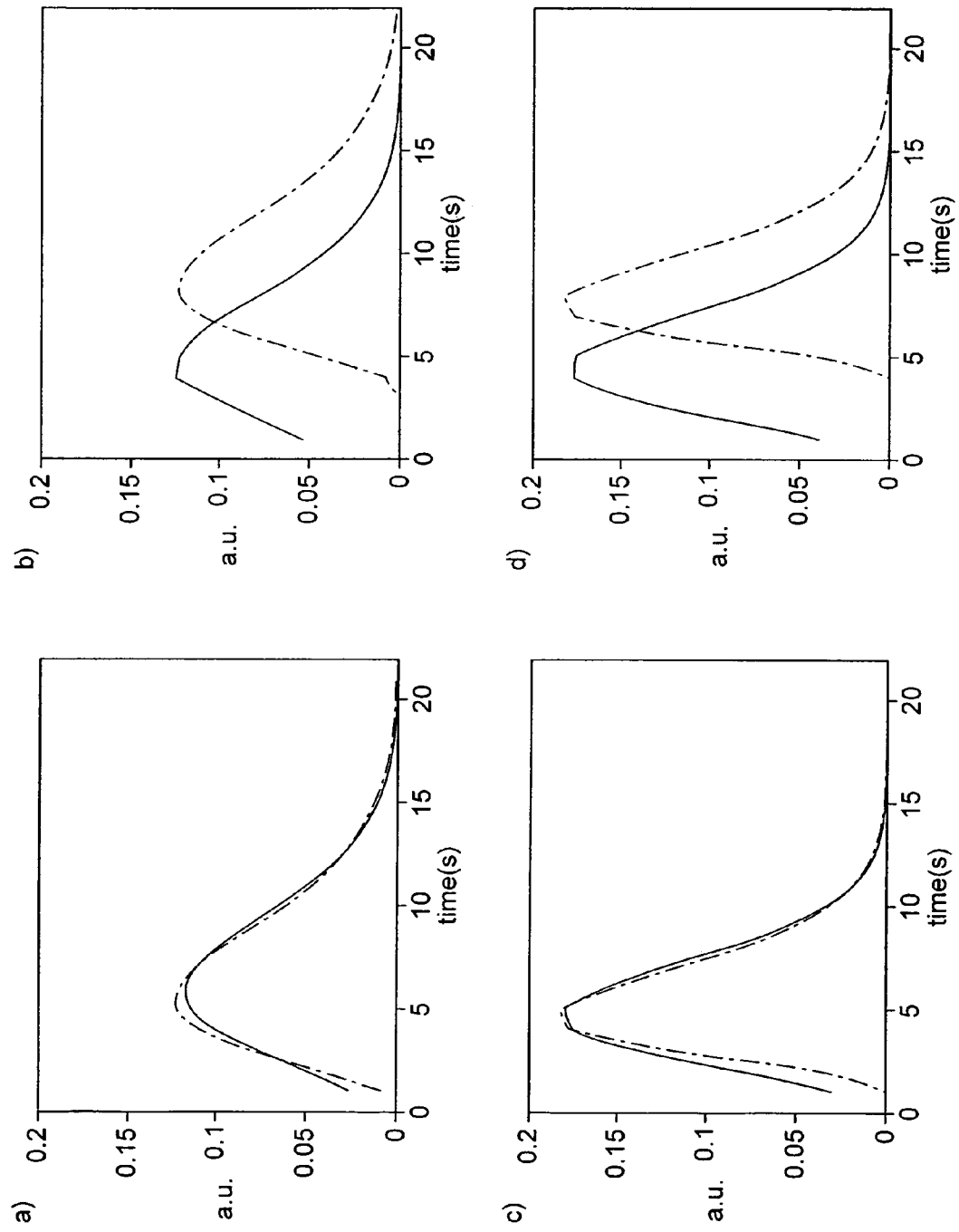
FIG. 2 is a plot of arterial input functions with no noise (Estimated (solid line) and simulated (dashed-dotted line). a) and b) case I in Table (1), c) and d) case II of Table (1). Delayed arrival time of 3 s in c) and d))
Figure 3:
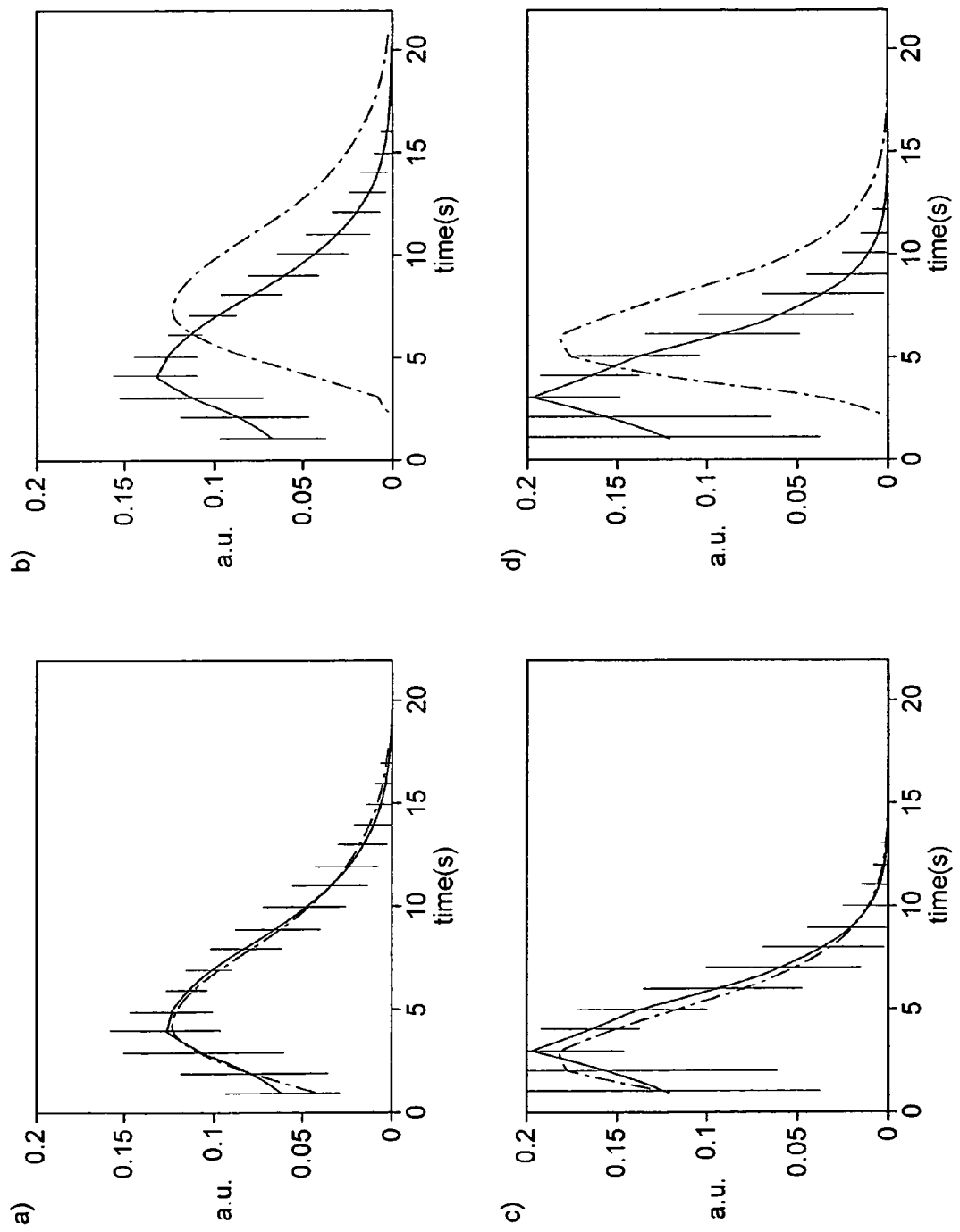
FIG. 3 is a plot of arterial input function with acquisition noise added (Estimated (mean value±two standard deviations, solid line) and simulated (dashed-dotted line). a) and b) case I in Table (1), c) and d) case II of Table (1). Delayed arrival time of 3 s in c) and d))
Figure 4:
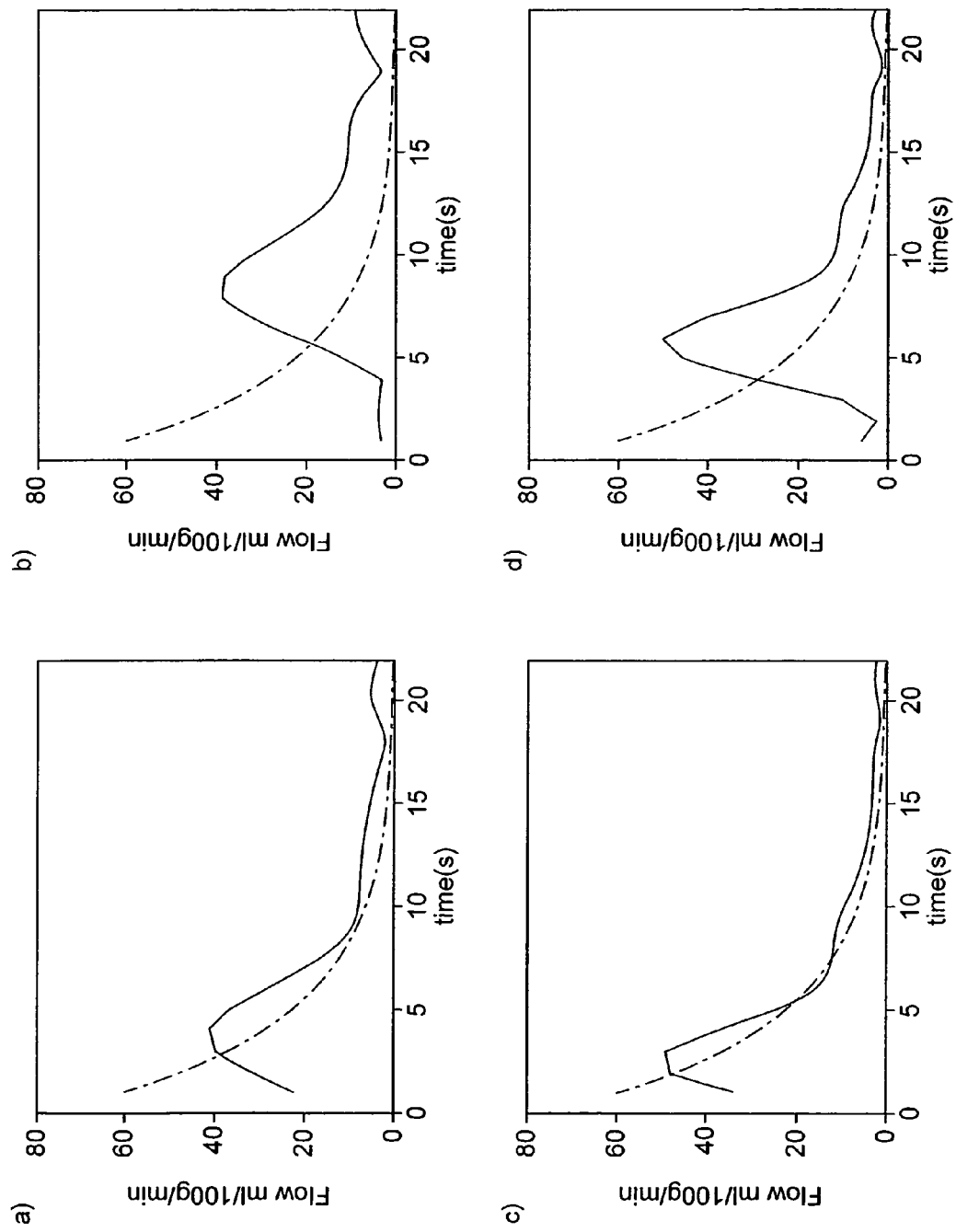
FIG. 4 is a plot of tissue residue functions scaled by flow with no noise (Deconvolved (solid line) and simulated exponential (dashed-dotted line). a) and b) case I in Table (1), c) and d) case II of Table (1) Delayed arrival time, 3 s, of the arterial input functions is used in c) and d))
Figure 5:
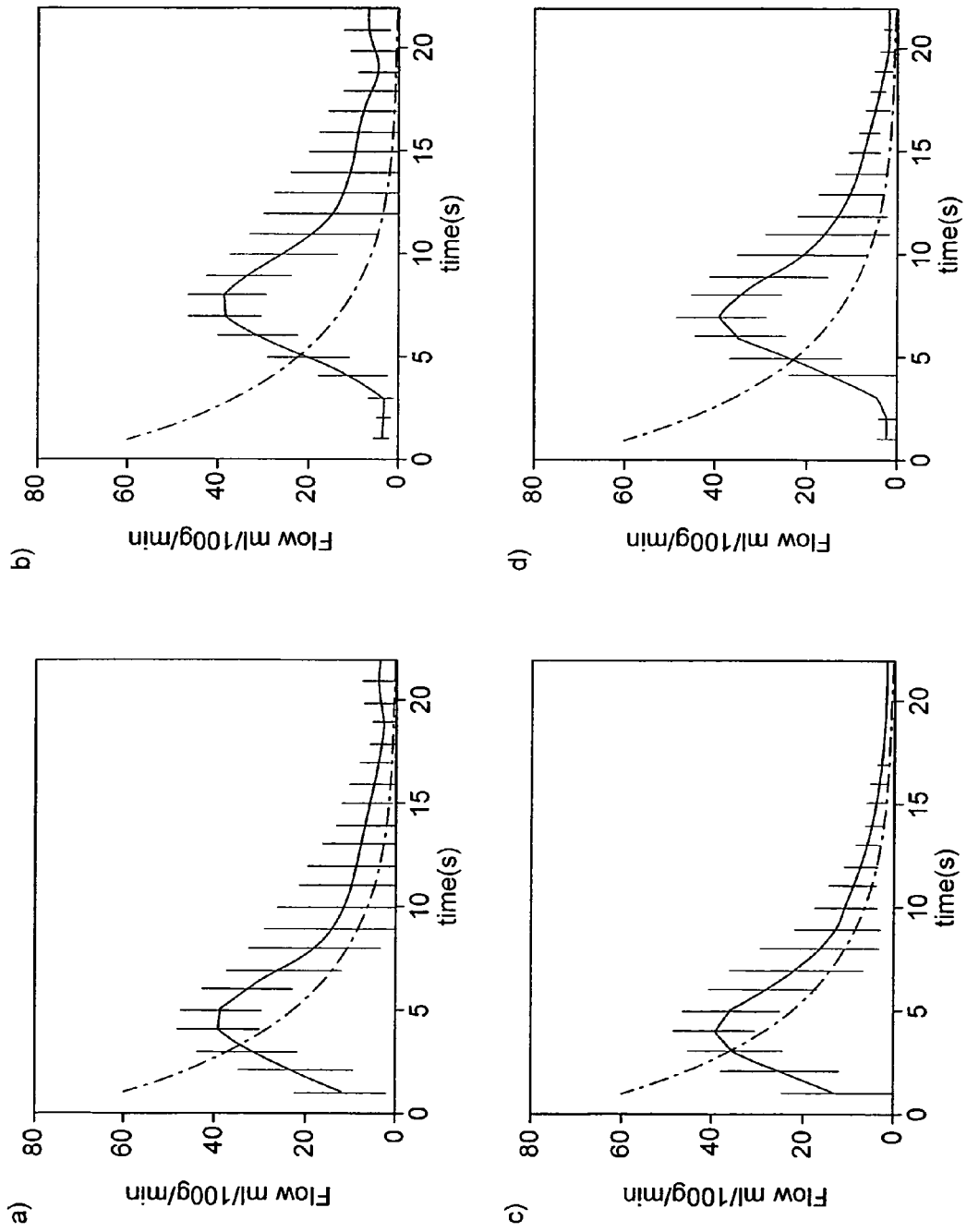
FIG. 5 is a plot of tissue residue functions scaled by flow with acquisition noise added (Deconvolved (solid line) and simulated exponential (dashed-dotted line). a) and b) case I in Table (1), c) and d) case II of Table (1) Delayed arrival time, 3 s, of the arterial input functions is used in c) and d))

The effects of dispersion and delay in the arterial input function were studied separately to simplify the interpretation of the simulation results. A delayed arrival time of the bolus injection was simulated by adding a delay $\Delta t_0$, $\Delta t_0 \in [0,5]$s, to the arterial input function. Dispersion was simulated by choosing different parameter values for the arterial input function. The area under the arterial input function was in each case normalised to unit area. Thus, the broader the arterial input function, the smaller the maximum amplitude. Alternatively, dispersion can also be achieved by convoluting the arterial input function with a transport function (see Calamante et al (supra)). Two different arterial input functions (see FIG. 1 of the accompanying drawings) are used in presentation of the delay and dispersion results. The same exponential tissue residue function is used for both arterial input functions Table (1). In the current algorithm, the different shapes of the simulated arterial input functions should be reconstructed. Any delayed time-of-arrival, on the other hand, is added to the tissue residue functions.

The arterial input function $v_i(t)$, and the tissue residue function (scaled by flow), $u_i(t)$, are separable in the complex cepstrum domain. To demonstrate this, various arterial input functions were convoluted with exponentially decaying box shaped or triangular tissue residue functions, respectively.

TABLE 1

Parameter values used in simulations.

| Arterial input function | | Tissue residue function |
|---|---|---|
| I | a = 3, b = 1.8 | F = 60 ml/100 g/min, MTT = 4 s |
| II | a = 3, b = 1.2 | F = 60 ml/100 g/min, MTT = 4 s |

Simulations were performed with the three different mean transit times in 3, 4 and 5 seconds.

Deconvolution algorithms are sensitive to noise. To test the noise sensitivity of the Wiener filter deconvolution, Monte Carlo simulations were used. The arterial input functions and tissue residue functions given in Table (1) (case 1) were applied with synthetically generated noise added. Independent Gaussian noise, with zero mean, was generated and applied to produce signal-to-noise ratios, SNRs, ranging from 10 to 10000. Results were computed by averaging over fifty individual time series.

EXAMPLE 2

MRI Experiments

The in vivo measurements included in this study were selected from a major ongoing study of professional deep-sea divers (N=120). The mechanisms by which the brain of deep sea divers is damaged is still unknown, however previous studies concluded that most findings could be explained by vascular obstructions. In this study, the selected subjects are considered healthy as no obvious pathology is identified. The perfusion acquisitions were performed on a Siemens Vision 1.5 T whole body clinical scanner. A standard, commercial gradient-echo planar imaging (GE-EPI) sequence, with parameters TR/TE=1442 ms/60.70 ms, FoV=230×230, Matrix=128×128, was selected. The contrast agent, Gadolinium Diethylene Triamine Penta-acetic Acid (Gd-DTPA—available as Magnevist® from Schering AG, was injected automatically after 12 seconds. In total, 50 time points were measured. Image data were transported to an off line computer for post processing. In addition to the proposed method, deconvolution was performed using a manually selected arterial input function. The procedures were implemented in C, including several Numerical Recipes routines. Image processing tools based on the XITE package and MATLAB were used for image handling, visualization and evaluation.

Both the band pass filter and the Wiener deconvolution filter should be optimized for the method to work optimally. In this study, these parameter values were optimized by inspecting the computed complex cepstrum and deconvolved contrast concentration functions, $u_t(t)$.

The same band pass filter value was chosen for all voxels in all in vivo studies. It is assumed that the most slowly varying function, the arterial input function, is located in the early part of the complex cepstrum, while the more rapidly varying tissue residue function is located at later times. Typically, the four or five lowest time bins in the complex cepstrum were selected to isolate the arterial input function. Generally, the outcome of the filtering was not much altered if an extra time bin was included or excluded when isolating the arterial input function.

The Wiener filter constant, q, is used when deconvolving the contrast concentration function from the estimated voxel specific arterial input function. This constant is directly related to the signal-to-noise ratio of the observed contrast concentration functions. By choosing a too small value for q, noise is enhanced. On the other hand, with a too large value of q, no deconvolution is achieved. In the simulations, a small q-value of 0.009 was chosen when no noise was added. This q-value was increased with increasing noise values: q[0.009, 0.15] for SNR∈ [10000, 10]. A value of q=0.05 was chosen for each voxel in the in vivo data.

EXAMPLE 3

Results

The simulated data were used to study the performance of the new, blind method for calculating voxel specific arterial input functions and tissue residue functions. The in vivo recordings were used to compare the performance of this method to the traditional method where a single arterial input function is manually selected.

The time course of the simulated arterial input functions was estimated accurately in the simulations both when no noise, FIG. (2), and acquired noise, FIG. (3), was added. As described above, the induced delay in arrival time (images to the right in both figures) is not included in the estimated arterial input functions.

The shape of the simulated residue functions was only partly reproduced in the deconvolved contrast concentration functions, $u_t(t)=F_i \cdot r_i(t)$. The initial amplitude of the exponential function (dashed-dotted line) was replaced by a more Gaussian shaped function (FIG. (4) and FIG. (5)). Similarly, the deconvolution procedure failed to reproduce the initial sharp edge of a linearly shaped, or the constant plateau of a box-shaped, tissue residue function (FIG. (6)). The delayed arrival time, which was added to the arterial input function in some simulations, (FIGS. (1c, d)-(2c, d)), was seen, as expected, in tissue residue functions (FIGS. (4c, d)-(5c, d)).

Repeated simulations, with input flow values of F=30 ml/100 g/min and F=60 ml/100 g/min using an exponentially shaped tissue residue function, showed an almost exact match between increase in delayed arrival of the simulated arterial input functions and the increase in computed time-to-peak values, TTP, (Table (2)).

For each of the simulated delays in contrast arrival, similar flow values were computed. Although independent of delay, the flow values were always underestimated compared to the input values (Table 2)). The same trend was seen when using other shapes for the tissue residue functions (FIG. (6)). For each shape of the tissue residue functions, a linear relation was found between the input and computed tissue flow values. The fact that no unique relation was found for all models chosen for the tissue residue functions, shows that the deconvolution procedure was dependent on the shape of the tissue residue function. The estimated arterial input functions were not influenced by the differently shaped input tissue residue functions, implying a fairly correct separation in the complex cepstrum.

The same Wiener filter constant was applied in all simulations. Thus, any effect obtained by optimizing this constant was ignored in the above simulations. Monte Carlo simulations, with various levels of Gaussian noise added, showed that input flow values (F=60 ml/100 g/min) were underestimated by the deconvolution procedure (FIG. 7). By repeatedly optimizing the Wiener filter constant, q, stability of the proposed method was obtained over the complete range of signal-to-noise values (FIG. (7a)). In FIG. (7a), q was increased six times in the presented range of signal-to-noise ratios, while a constant q=0.01 was applied in FIG. (7b).

TABLE 2

Estimated time-to-peak, TTP, and flow, $F_{est}$ (mean value ± standard deviation). Simulation parameters as case I in Table (1). Acquired noise added.

| | TTP [S] | $F_{est}$ [ml/100 g/min] (F = 30 ml/100 g/min) | TTP [S] | $F_{est}$ [ml/100 g/min] (F = 60 ml/100 g/min) |
|---|---|---|---|---|
| ∈$t_0$ = 0 s | 4.4 ± 0.6 | 20.2 ± 1.7 | 4.7 ± 0.7 | 41.0 ± 5.2 |
| ∈$t_0$ = 1 s | 5.2 ± 0.5 | 20.5 ± 1.7 | 5.5 ± 0.7 | 41.4 ± 4.6 |
| ∈$t_0$ = 2 s | 6.2 ± 0.6 | 20.0 ± 1.6 | 7.0 ± 1.1 | 40.8 ± 4.8 |
| ∈$t_0$ = 3 s | 7.6 ± 0.6 | 20.0 ± 1.7 | 8.5 ± 1.8 | 41.4 ± 4.9 |
| ∈$t_0$ = 4 s | 8.6 ± 0.5 | 20.1 ± 1.7 | 9.2 ± 1.5 | 41.0 ± 3.9 |
| ∈$t_0$ = 5 s | 9.9 ± 0.8 | 19.5 ± 1.3 | 10.5 ± 1.3 | 40.6 ± 3.7 |

The performance of the proposed blind estimation method in in vivo measurements was evaluated by comparing to results obtained from the conventional method where an in-slice, manually selected arterial input function is used in the deconvolution. For comparison, this arterial input function was normalized to unit area prior to deconvolution. Parametric maps describing blood flow, F, mean transit time, MTT, and time-to-peak, TTP, were computed in both cases.

The time course of the deconvolved contrast concentrations showed that the first pass of contrast bolus was visible in fewer time frames when using the new method compared to the conventional method, FIG. (8). This suggests differences in mean transit times and time-to-peak values between the two methods.

Voxel-wise comparison showed that 60% of the object voxels had more than 5% decrease in mean transit time compared to the conventional method (average decrease of 19.6% relative to the conventional method). A slight increase in mean transit time was seen in 20% of the object voxels, with an average value (19%). More than 5% increase in flow values were seen in 40% of the object image voxels when using the new method (mean increase of 21.2% relative to conventional method), while 35% of the remaining voxels showed decreased values (mean decrease 19.2% relative to conventional method).

About 37% of all object image voxels had more than 5% increase in time-to-peak in the new method compared to the conventional method (mean increase 50%), while all other object voxels had less than 5% difference between the two methods. The parametric images were noisy (FIG. (9)), but the different tissue structures were clearly more visible when using the new method (right column) compared to the conventional method (left column).

For quantitative analysis, regions-of-interest representing normal frontal white matter (WM) and normal cortical grey matter (GM) were selected (Table (3)). Similar flow ratios of grey matter to white matter were obtained when using the blind estimation method (GM/WM=2.4±0.7) and the manually selected arterial input function method (GM/WM=2.3±0.7). The mean transit time values were smaller when using blindly estimated arterial input functions. The difference in time-to-peak between gray matter and white matter regions was larger when using the blind estimation method (1.7±0.8 s) compared to the conventional method (0.8±0.8 s), allowing better visual differentiation of the tissue structures.

TABLE 3 perfusion parameters

| | Blind Estimation | | Conventional | |
|---|---|---|---|---|
| | GM | WM | GM | WM |
| CBF | 2.3 ± 0.6 | 0.9 ± 0.2 | 2.2 ± 0.6 | 0.9 ± 0.3 |
| TTP | 29.4 ± 0.5 | 31.1 ± 0.7 | 28.9 ± 0.5 | 29.7 ± 0.9 |
| MTT | 4.2 ± 0.6 | 5.0 ± 1.1 | 4.6 ± 0.5 | 5.2 ± 0.8 |

EXAMPLE 4

Imaging Study

The subjects were chosen from a database where male deep sea divers had been examined with an extensive MR protocol of conventional MR imaging and perfusion MR imaging. From the database, the ten youngest male divers without obvious pathology were selected. The males had mean age 39.4 (range 33-43 years).

The MR images were recorded with a Siemens Vision 1.5 Tesla whole body clinical scanner. All patients had perfusion MR examinations using dynamic susceptibility contrast imaging. A gradient-echo echo-planar sequence with parameters TR/TE 1442 ms/60.70 ms, flip angle 90 degrees, field of view 230×230 pixels and matrix size 128×128 pixels was used. Slice thickness: 5 mm with a 0.3 mm interslice gap. Scan time: 1 minute and 12 seconds with 11 slices and 50 acquisitions per slice. Slice orientation parallel to a line drawn between basis of the frontal lobe and caudal border of cerebellum. Contrast agent: 1 mmol/ml gadobutrol. Contrast volume: 0.2 ml/kg of body weight. All examinations were performed using a power injector with a rate of 5 ml/s through a 18-gauge i.v. catheter in a cubital vein. The contrast injection delay was 12 seconds followed directly by injection of 20 ml 0.9 mg/ml sodium chloride.

The perfusion images were transferred to an off line computer for post-processing. Image processing tools were the XITE public domain image processing package from the Dept. of Informatics, University of Oslo, Norway.

The first pass bolus signal and the second pass bolus signal did not overlap in time. Hence, recirculation effects were avoided by simply using the first pass bolus part in the voxel specific arterial input function determination. Since the perfusion recordings were done on healthy males, the blood brain barrier was assumed intact. Hence, no leakage term had to be included in the determination of the voxel specific arterial input functions. The deconvolution step was done by simple Wiener filtering in the frequency domain with the same empirically found inverse squared signal to noise ratio for all deconvolutions.

Manual selection of arterial input function: Arterial input function voxels were selected manually in the same slice as the anatomic regions of interest were defined. The six voxels with the earliest, most rapid and marked signal drop from the circumference of arteria cerebri anterior were selected.

Selection of anatomical regions: All regions of interest were selected from the slice where deep grey matter nuclei were best defined. These regions of interest were drawn manually by selecting about 20 voxels from each caput nucleus caudatus and nucleus lentiformis, from left and right frontal cerebral cortex and left and right frontal white matter (see FIG. 10 a, b). Voxels within the region of interest with signals similar to the arterial input function were excluded. They must have contained arteries or veins.

Following deconvolution, the region of interest masks were used to compute the mean values and standard deviations of rTTP, rMTT, rCBF and rCBV for each region of interest.

Signals and Statistical Analysis: The blind deconvolution method of the invention normalized each arterial input function to unit area. Hence, it was only meaningful to compare ratios of rCBF and rCBV for different tissues. Note, however, that a correct normalization can easily be obtained by incorporating a method to automatically identify arterial input functions of large arteries.

Ideally, deconvolution should not affect the voxel specific cerebral brain volumes. However, all deconvolution methods decrease the signal to noise ratio and might affect the residue functions of various tissues differently. As a consequence, the ratio between the cerebral blood volume of grey and white matter might be changed following deconvolution. The ratio was computed for the blind deconvolution method of the invention, for the conventional deconvolution method and with no deconvolution.

The two sided Wilcoxon signed rank test was used to identify statistically significant differences between the two deconvolution methods. The test was done for rTTP, rMTT and for the ratios of rCBF and rCBV. A p-value smaller than 0.0125 on each tail was considered significant. Two digits were used when computing significance levels to avoid most ties.

Regional time to peak: The time to peak was slightly longer for both grey and white matter with the new method than with the conventional method (1.8% and 6.0%, Table 4). The corresponding difference in peak times of grey and white matter was substantially larger for the new method (36.8%, Table 4).

Regional mean transit time: The mean transit time for grey matter was not significantly different for the two methods. In contrast, the time difference between the mean transit times of grey and white matter was substantially longer for the new method than for the conventional method (21.3%, Table 5).

Regional cerebral flood flow: The flow ratio between grey and white matter was not significantly different for the two methods (Table 6).

Regional cerebral blood volume: The volume ratio between gray and white matter was slightly lower for the new method than for the conventional method. Correspondingly, the volume ratio between gray and white matter was lower for the conventional method than for volume computation from the observed data with no deconvolution (Table 7).

TABLE 4

Regional time to peak. In seconds.

| | | Method of Invention | | | Conventional Method | | |
|---|---|---|---|---|---|---|---|
| Subject | Age (y) | Grey Matter | White Matter | Time Difference | Grey Matter | White Matter | Time Difference |
| 1 | 43 | 13.6 ± 0.5 | 15.3 ± 2.9 | 1.7 | 12.9 ± 0.7 | 14.0 ± 1.1 | 1.1 |
| 2 | 40 | 13.7 ± 0.7 | 16.2 ± 4.2 | 2.6 | 13.7 ± 0.6 | 15.9 ± 5.7 | 2.2 |
| 3 | 40 | 16.0 ± 0.9 | 17.6 ± 1.1 | 1.7 | 15.9 ± 0.8 | 17.6 ± 2.3 | 1.8 |
| 4 | 38 | 11.3 ± 0.9 | 13.3 ± 1.1 | 2.0 | 11.2 ± 0.8 | 12.8 ± 0.1 | 1.7 |
| 5 | 33 | 16.3 ± 0.8 | 20.7 ± 4.8 | 4.4 | 16.0 ± 0.8 | 18.6 ± 2.7 | 2.7 |
| 6 | 40 | 14.6 ± 1.1 | 18.4 ± 2.9 | 3.8 | 15.0 ± 0.8 | 17.6 ± 1.7 | 2.6 |
| 7 | 41 | 12.0 ± 0.7 | 14.6 ± 1.4 | 2.5 | 11.8 ± 0.8 | 14.2 ± 2.0 | 2.4 |
| 8 | 42 | 11.7 ± 1.3 | 13.9 ± 2.6 | 2.2 | 10.8 ± 1.4 | 11.5 ± 2.0 | 0.7 |
| 9 | 41 | 19.2 ± 1.3 | 22.4 ± 2.8 | 3.3 | 18.7 ± 1.1 | 21.5 ± 2.9 | 2.7 |
| 10 | 36 | 16.4 ± 1.1 | 19.7 ± 3.2 | 3.3 | 16.3 ± 0.8 | 18.5 ± 2.9 | 2.2 |
| Mean | 39.4 | 14.5 ± 2.5 | 17.2 ± 3.1 | 2.8 ± 0.9 | 14.2 ± 2.6 | 16.2 ± 3.1 | 2.0 ± 0.7 |

Significance levels:
Grey matter, p = 0.024.
White matter, p = 0.002.
Time difference, p = 0.002.

TABLE 5

Regional mean transit time. In seconds.

| | | Method of Invention | | | Conventional Method | | |
|---|---|---|---|---|---|---|---|
| Subject | Age (y) | Grey Matter | White Matter | Time Difference | Grey Matter | White Matter | Time Difference |
| 1 | 43 | 5.0 ± 0.7 | 6.6 ± 0.7 | 1.6 | 5.4 ± 0.6 | 6.5 ± 1.2 | 1.1 |
| 2 | 40 | 5.6 ± 0.8 | 7.5 ± 0.7 | 1.9 | 5.7 ± 0.7 | 7.2 ± 1.7 | 1.5 |
| 3 | 40 | 6.1 ± 0.9 | 7.6 ± 0.9 | 1.5 | 5.9 ± 0.8 | 7.3 ± 1.4 | 1.4 |
| 4 | 38 | 4.8 ± 0.7 | 6.2 ± 1.3 | 1.3 | 5.4 ± 0.7 | 6.3 ± 1.1 | 0.9 |
| 5 | 33 | 6.3 ± 0.9 | 7.9 ± 0.9 | 1.6 | 6.4 ± 0.7 | 7.8 ± 1.4 | 1.5 |
| 6 | 40 | 6.7 ± 1.0 | 7.9 ± 0.8 | 1.2 | 6.5 ± 0.8 | 7.4 ± 1.1 | 0.9 |
| 7 | 41 | 5.1 ± 0.9 | 6.2 ± 0.9 | 1.1 | 5.0 ± 0.7 | 6.2 ± 1.4 | 1.2 |
| 8 | 42 | 6.6 ± 1.1 | 7.6 ± 0.6 | 1.0 | 6.7 ± 1.0 | 7.4 ± 1.3 | 0.6 |
| 9 | 41 | 6.9 ± 1.0 | 7.8 ± 0.8 | 0.9 | 6.5 ± 0.7 | 7.3 ± 1.4 | 0.8 |
| 10 | 36 | 6.4 ± 0.8 | 7.4 ± 0.9 | 1.1 | 6.4 ± 0.6 | 7.4 ± 1.3 | 1.0 |
| Mean | 39.4 | 5.9 ± 0.8 | 7.3 ± 0.7 | 1.3 ± 0.3 | 6.0 ± 0.6 | 7.1 ± 0.5 | 1.1 ± 0.3 |

Significance levels:
Grey matter, p = 0.41.
White matter, p = 0.022.
Time difference, p = 0.001

TABLE 6

Regional cerebral blood flow.

| | | Method of the invention | | | Conventional method | | |
|---|---|---|---|---|---|---|---|
| Subject | Age (y) | Grey Matter | White Matter | Time Difference | Grey Matter | White Matter | Time Difference |
| 1 | 43 | 2.3 ± 0.4 | 0.9 ± 0.2 | 2.5 | 2.3 ± 0.5 | 0.9 ± 0.2 | 2.6 |
| 2 | 40 | 2.0 ± 0.5 | 0.6 ± 0.2 | 3.3 | 2.3 ± 0.5 | 0.7 ± 0.2 | 3.3 |
| 3 | 40 | 2.2 ± 0.5 | 0.9 ± 0.3 | 2.5 | 2.5 ± 0.6 | 1.0 ± 0.3 | 2.5 |
| 4 | 38 | 2.8 ± 0.6 | 1.4 ± 0.4 | 2.0 | 3.2 ± 0.7 | 1.5 ± 0.4 | 2.1 |
| 5 | 33 | 2.3 ± 0.4 | 1.1 ± 0.2 | 2.1 | 2.5 ± 0.5 | 1.1 ± 0.3 | 2.4 |

TABLE 6-continued

Regional cerebral blood flow.

| | | Method of the invention | | | Conventional method | | |
|---|---|---|---|---|---|---|---|
| Subject | Age (y) | Grey Matter | White Matter | Time Difference | Grey Matter | White Matter | Time Difference |
| 6 | 40 | 2.3 ± 0.4 | 0.8 ± 0.2 | 2.7 | 3.0 ± 0.6 | 1.1 ± 0.2 | 2.9 |
| 7 | 41 | 2.4 ± 0.4 | 1.3 ± 0.3 | 1.9 | 2.6 ± 0.6 | 1.2 ± 0.3 | 2.2 |
| 8 | 42 | 1.5 ± 0.4 | 0.8 ± 0.2 | 2.0 | 1.3 ± 0.5 | 0.9 ± 0.5 | 1.5 |
| 9 | 41 | 1.8 ± 0.5 | 0.7 ± 0.2 | 2.5 | 2.2 ± 0.5 | 0.9 ± 0.2 | 2.6 |
| 10 | 36 | 2.2 ± 0.3 | 0.9 ± 0.3 | 2.5 | 2.5 ± 0.4 | 0.9 ± 0.2 | 2.8 |
| Mean | 39.4 | 2.2 ± 0.4 | 0.9 ± 0.3 | 2.4 ± 0.4 | 2.4 ± 0.5 | 1.0 ± 0.2 | 2.5 ± 0.5 |

Significance level for ratio, p = 0.097.

TABLE 7

Regional cerebral blood volume ratios.

| Subject | Age (y) | Invention Method | Conventional Method | No deconvolution |
|---|---|---|---|---|
| 1 | 43 | 2.0 | 2.3 | 2.4 |
| 2 | 40 | 2.5 | 2.5 | 3.3 |
| 3 | 40 | 2.0 | 2.1 | 2.2 |
| 4 | 38 | 1.6 | 1.9 | 1.7 |
| 5 | 33 | 1.8 | 1.9 | 1.9 |
| 6 | 40 | 2.3 | 2.6 | 2.6 |
| 7 | 41 | 1.6 | 1.8 | 2.2 |
| 8 | 42 | 1.7 | 1.4 | 2.3 |
| 9 | 41 | 2.3 | 2.4 | 2.8 |
| 10 | 36 | 2.3 | 2.5 | 2.6 |
| Mean | 39.4 | 2.0 ± 0.3 | 2.1 ± 0.4 | 2.4 ± 0.5 |

Significance level; new method and conventional method, p = 0.042; conventional method and no deconvolution, p = 0.092.

EXAMPLE 5

Simulations and Imaging

Synthetic data were generated as above. Parameters were adjusted to mimic data acquired during a typical, in vivo magnetic resonance T2* perfusion examination. These simulations were performed to investigate how the method of the invention performs in the presence of recirculation. An exponential function having a delay of 8 s and a dispersion with a time constant of 30 s was convolved with either of the two arterial functions (and tissue residue functions) given above.

In vivo imaging was done on one patient with a tumour in the left frontal lobe of the cerebrum using a Siemens Vision 1.5 T whole body clinical scanner. The perfusion examination was part of the routine, clinical evaluation.

A standard, commercial gradient-echo planar imaging (GE-EPI) sequence, with parameters TR/TE=1442 ms/60.70 ms, FoV=230×230, Matrix=128×128, was selected. The contrast agent, Gadolinium Diethylene Triamine Penta-acetic Acid (Gd-DTPA, Schering), was automatically injected after 12 seconds. Eleven sections parallel to the base of the cranium were recorded and 50 time points were measured for each voxel. Image data were transported to an off line computer for post processing. The procedures were implemented in C, including several Numerical Recipes routines. Image processing tools based on the XITE package and MATLAB were used for image handling, visualization and evaluation.

After logarithmic transform of all acquired data, frames 3 to 14 of each image sequence were used to compute a base line tissue signal of each voxel. This base line constant signal was subtracted from the logarithmic transformed voxel signal to give the voxel specific contrast signal.

The computations were done with scripts under Linux, where each minor processing step was stored to disc on a personal computer with a Pentium II board. The computation time for each section was about 20 minutes within this framework. Simple optimization on a modern computer will reduce the computation time by a factor of 50-100.

To estimate tissue specific parameters within small localized regions, small tissue masks were drawn interactively on a screen. More than 20 voxels were labelled for each tissue class. The masks for grey matter and white matter were in the left parietal region. Region 1 of the tumor was located peripherally, while region 2 was located centrally to the part which had the largest contrast signals.

Using only complex cepstrum estimation of the voxel specific arterial input functions, inclusion of leakage and recirculation terms reduced the variance of the tissue specific hemodynamic volume and time parameters (Tables 8 and 9, models 1 and 2). Refinement of the voxel specific arterial input function estimates and tissue residue function estimates by iterative chain deconvolution reduced the variance of the tissue specific hemodynamic volume and time parameters further (Table 8 and 9, models 2 and 5). The leakage term was more important than the recirculation term in the variance reduction (Tables 8 and 9, models 2, 3 and 5).

The reduced variance in the tissue specific hemodynamic volume and time parameters with the complete model and iterative chain estimates made the different tissue components easier to separate visually in the parametric images (FIG. 11). In particular, the tumor became more distinct with high blood volumes, high blood flow, mixed time to peaks and fairly long mean transit times. Also the time course of the tissue residue functions became much smoother and of apparent shorter duration (FIG. 12).

The estimated leakage coefficients were low and similar for both grey matter, white matter and the two tumor regions (Table 10). Ignoring recirculation had only a very minor effect on the estimated leakage coefficients (Table 10, FIG. 13a,b). Thus, the persistence of a distinct contrast signal in the tumor area after the first pass bolus had passed (FIG. 13,c,d), has to be explained by more leakage than in normal cerebral cortex due to high blood flow (see Table 8). The high contrast signals in the meningeal membranes and in the plexus choroideus of the steady state leakage images (FIG. 13,c,d), were in accordance with the fact that the capillaries in these tissues are permeable to contrast.

The circulation path from the heart and back is longer for white matter than grey matter. This is because the brain arteries enter the brain through grey matter before entering white matter. Hence, the recirculation time should be longer for white matter than for grey matter.

The tissue specific recirculation times of the complete model with iterative chain estimates were in agreement with this prediction (Table 10 and FIG. 13e). In contrast, when the leakage term was ignored, the recirculation time for grey matter, white matter and the two tumor regions all became long and more similar (Table 10 and FIG. 13f).

TABLE 8

Hemodynamic volume parameters.

| Model | Grey Matter | White Matter | Tumor Region 1 | Tumor Region 2 |
|---|---|---|---|---|
| cerebral blood volume (relative units) | | | | |
| 1 | 3.36 ± 0.10 | 1.00 ± 0.05 | 5.28 ± 0.22 | 8.22 ± 0.39 |
| 2 | 3.03 ± 0.09 | 1.00 ± 0.05 | 4.35 ± 0.09 | 5.94 ± 0.18 |
| 3 | 3.03 ± 0.09 | 1.00 ± 0.04 | 4.35 ± 0.12 | 6.05 ± 0.14 |
| 4 | 2.97 ± 0.08 | 1.00 ± 0.04 | 4.41 ± 0.10 | 5.75 ± 0.15 |
| 5 | 2.94 ± 0.08 | 1.00 ± 0.04 | 4.23 ± 0.10 | 5.67 ± 0.15 |
| cerebral blood flow (relative units) | | | | |
| 1 | 4.21 ± 0.16 | 1.00 ± 0.06 | 7.29 ± 0.43 | 8.11 ± 0.35 |
| 2 | 3.47 ± 0.12 | 1.00 ± 0.06 | 5.08 ± 0.17 | 5.83 ± 0.23 |
| 3 | 3.35 ± 0.08 | 1.00 ± 0.05 | 4.67 ± 0.12 | 5.40 ± 0.13 |
| 4 | 3.12 ± 0.07 | 1.00 ± 0.05 | 4.40 ± 0.11 | 5.47 ± 0.11 |
| 5 | 3.10 ± 0.07 | 1.00 ± 0.05 | 4.29 ± 0.10 | 5.34 ± 0.10 |

Mean ± S.D.
Number of voxels for gray matter, 54; white matter, 59, tumor region 1, 30; tumor region 2, 22. All values relative to mean value of white matter.
Model 1, complex cepstrum estimates only, neither recirculation nor leakage included.
Model 2, complex cepstrum estimates only, recirculation and leakage included.
Model 3, iterative estimates, recirculation included, leakage not included.
Model 4, iterative estimates, recirculation not included, leakage included.
Model 5, iterative estimates, recirculation and leakage included.

TABLE 9

Hemodynamic time parameters.

| Model | Grey Matter | White Matter | Tumor Region 1 | Tumor Region 2 |
|---|---|---|---|---|
| time to peak (frames) | | | | |
| 1 | 4.26 ± 0.08 | 5.87 ± 0.24 | 3.30 ± 0.13 | 3.77 ± 0.43 |
| 2 | 4.56 ± 0.08 | 5.81 ± 0.15 | 3.27 ± 0.08 | 3.73 ± 0.11 |
| 3 | 6.19 ± 0.05 | 7.52 ± 0.13 | 3.93 ± 0.11 | 2.73 ± 0.11 |
| 4 | 6.52 ± 0.08 | 7.34 ± 0.13 | 5.30 ± 0.08 | 5.73 ± 0.09 |
| 5 | 6.54 ± 0.07 | 7.36 ± 0.13 | 5.40 ± 0.09 | 5.82 ± 0.08 |
| mean transit (frames) | | | | |
| 1 | 4.04 ± 0.11 | 5.40 ± 0.19 | 3.71 ± 0.13 | 5.01 ± 0.11 |
| 2 | 3.56 ± 0.08 | 4.34 ± 0.14 | 3.51 ± 0.10 | 4.15 ± 0.12 |
| 3 | 4.02 ± 0.07 | 4.81 ± 0.19 | 4.22 ± 0.09 | 5.05 ± 0.16 |
| 4 | 3.90 ± 0.06 | 4.35 ± 0.12 | 4.14 ± 0.06 | 4.34 ± 0.11 |
| 5 | 3.91 ± 0.06 | 4.36 ± 0.12 | 4.20 ± 0.06 | 4.38 ± 0.09 |

Mean ± S.D.
Model 3, iterative estimates, recirculation included, leakage not included.
Model 4, iterative estimates, recirculation not included, leakage included.
Model 5, iterative estimates, recirculation and leakage included.
The time distance between two successive frames: 1440 ms.

TABLE 10

Leakage and recirculation. Picard iterations.

| Model | Grey Matter | White Matter | Tumor Region 1 | Tumor Region 2 |
|---|---|---|---|---|
| leakage coefficient | | | | |
| 5 | 0.019 ± 0.001 | 0.019 ± 0.002 | 0.015 ± 0.002 | 0.022 ± 0.001 |
| 6 | 0.019 ± 0.001 | 0.021 ± 0.002 | 0.015 ± 0.002 | 0.022 ± 0.001 |
| recirculation time (frames) | | | | |
| 5 | 15.8 ± 0.4 | 18.0 ± 0.6 | 15.5 ± 0.2 | 15.0 ± 0.2 |
| 7 | 18.1 ± 0.3 | 18.3 ± 0.5 | 18.3 ± 0.3 | 17.5 ± 0.1 |

Mean ± S.D.
Model 5, recirculation and leakage included.
Model 6, recirculation included, leakage not included.
Model 7, recirculation not included, leakage included.
The time distance between two successive frames: 1440 ms.

EXAMPLE 6

Simulations

Synthetic data of the first pass signal was simulated for the purpose of evaluating the Richardson-Lucy iterative blind deconvolution method. The influence of the leakage and recirculation modeling was evaluated in a few in vivo measurements.

For the first pass data, convolution, $c(t)=u(t)*v(t)$, between synthetically generated arterial input functions and tissue residue function was performed using simple multiplication in Fourier domain. The arterial input function was modeled by a gamma variate function of time, t, $$v(t) = c_0(t-t_0)^\alpha e^{-(t-t_0)/\beta} \quad (27)$$

where $t_0$ is the contrast arrival time, $c_0$, $\alpha$ and $\beta$ parameters determining the shape of gamma function. The expression for the arterial input function was valid for all values $t \geq t_0$, and elsewhere zero. Values $\alpha=3$ and $\beta \cdot [1.2, 2.0]$ were selected to study arterial input functions with different shapes. For all arterial input functions, $c_0$ was used to normalize the arterial input functions to unit area. The tissue residue functions scaled by cerebral blood flow, CBF, were simulated by linear or exponential shapes, $$u_{exp}(t) = CBF \cdot e^{\frac{1}{MTT}} \quad t \geq 0 \quad (28)$$

$$u_{lin}(t) = CBF \cdot \left(1 - \frac{1}{2MTT}\right) \quad t \leq 2MTT \quad (29)$$

$$u_{box}(t) = CBF \quad t \leq MTT \quad (30)$$

and zero for all other time points (Østergaard et al.). A larger range of flow values, CBF·[10, 60] ml/100 g/min were investigated for fixed mean transit times, MTT=4 seconds.

The convolved data, c(t), were transformed to MR signal intensities, s(t), through, $$s(t) = s_0(t) e^{-k \cdot TE \cdot \frac{P}{k_H} \cdot o(t)} + N \cdot \eta(t), \quad (31)$$

assuming a linear relation between the vascular contrast concentration and the observed susceptibility contrast. TE was the echo time of the sequence and k an experimental specific constant assumed common for all tissues (here set to unity), d was the density of brain tissue, and $k_H$ a correction factor for hematocrit differences between capillaries and large vessels (McCallum Optics Communications 75: 101-105 (1990)). The baseline signal intensities, so, were set to values commonly obtained in perfusion examinations for normal gray matter (500 MR Units). Finally, image noise o(t), t=1, ..., 50 from outside object boundaries in a real in vivo examination was added, allowing 64×64 image voxels with individual noise variations. Before adding the image noise, the mean value over all noise voxels was subtracted. Noise was added with different scaling factors (N=0,1,2.5,4) to obtain different signal-to-noise ratios. This gave pre contrast noise standard deviation, $\sigma_s$=0, 15, 30, 50, respectively.

EXAMPLE 7

MRI Experiments

Data obtained from two patients with various cerebrovascular abnormalities were used to test the proposed methodology; one patient with tumor (anaplastic oligoastrocytoma) in the left frontal lobe of the cerebrum and one patient suffering from fibromuscular dysplasia.

The in vivo perfusion examinations were all part of routine, clinical evaluation. No experimental investigations were done on the patients, and the acquired data were used in agreement with hospital policies. A standard, vendor provided gradient-echo echo planar imaging sequence (GE-EPI, Siemens Vision 1.5 T, Erlangen, Germany), with parameters TR/TE=1442 ms/60.70 ms, Flip angle=90 degrees, Field of View=230×230 mm, Matrix=128×128, was selected. The contrast agent Gadovist (Schering, Germany) was automatically injected after 12 seconds using an MR-compatible power injector (Medirad, Pittsburg), and dose according to body weight (0.2 mmol/kg). Subsequent saline flushing was performed with the same injection speed (5 ml/s) as was used for the contrast injection. Eleven image slices, slightly tilted from a true axial acquisition to avoid susceptibility artifacts in the frontal sinuses, were measured repeatedly for a total of fifty time points.

EXAMPLE 8

The synthetic data were generated in MATLAB (Mathworks, Natic, Mass., USA). These data and the acquired image data were subsequently processed and visualized using a special, extended implementation of the otherwise commercially available nICE software provided by NordicNeuroLab AS (NordicNeuroLab AS, Bergen, Norway). The proposed methodology was implemented by the authors using C/C++, including several Numerical Recipes routines (Press et al. Numerical Recipes in C, Cambridge University Press (1992)). The computation time using the current implementation on a 2.2 GHz Pentium III Intel Processor, was 15 seconds for one in vivo image slice (128×128 voxels) with 50 time point measurements.

After logarithmic transform of the simulated or acquired perfusion time series, about ten precontrast images were averaged to compute a base line tissue signal of each voxel. The precontrast image ranges and a limit for the first pass were selected interactively for each time series, but common for all voxels in the series. The base line was subtracted from the logarithmic transformed voxel signals to give the voxel specific contrast signals. No smoothing was performed.

To investigate the influence of the leakage and recirculation modeling, small (6×6 voxels) regions of interest in gray matter, white matter and pathologic regions were selected from the patient data, averaged and followed through the various post processing steps. Estimates of m, $\kappa_i$, $T_i$ in different regions were computed. Blood volume was computed as the area under the first pass signal resulting after subtracting leakage and recirculation. This blood volume was compared to blood volume computed as the area under all acquired time points, as the area under a selection of time points representative of the first pass, and as the area under a gamma fitted first pass function.

After deconvolution, hemodynamic maps of cerebral blood flow, cerebral blood volume (defined as the area of the deconvolved contrast concentrations), mean transit time and time-to-peak, were computed voxelwise for all time series. Blood flow and blood volume were identified as the maximum value and the area of the deconvolved contrast signals, respectively. Mean transit time was subsequently computed from the central volume theorem, MTT=CBV/CBF, and time-to-peak was set to the time point were the maximum value of the estimated arterial input function occurred. While the normalization of the arterial input function in in vivo data, influences the absolute values of blood flow and blood volume, the mean transit time values are comparable to those obtained when the true area of the arterial input functions is used.

For the simulated data, the computed hemodynamic parameters were compared with the true, input values. The simulations allowed to test the iterative algorithm for reproducibility of (i) differently shaped arterial input functions, (ii) different flow conditions, (iii) differently shaped tissue residue function (i.e. different vascular structures) (iv) different signal-to-noise ratios.

For the in vivo data, the voxel specific arterial input functions and the deconvolved tissue residue functions were visualized as functions of time. Additionally, region of interest analysis were performed by interactively selecting tissue regions (14×14 voxels) in the computed hemodynamic maps. These results were compared to values obtained in the same regions using the standard approach with Truncated Singular Value Decom-position (fixed truncation threshold of 0.2) (Østergaard et al. MGM 50: 164-174 (2003)). In the standard approach, which in the following is referred to as the global approach, the artery contrast signal is used as the arterial input function in all voxels. The global arterial input function was selected semi-automatically by finding the in-slice image voxels with the earliest and largest changes in contrast signal intensities. A gamma variate function was subsequently fitted to this arterial signal to avoid recirculation effects, FIG. (20). For reasons of compatibility, this global arterial input function was normalized to unit area prior to deconvolution.

EXAMPLE 9

Results

The new method gave a good voxelwise approximation to the leakage and recirculation, otherwise contaminating the first pass signal (selected examples FIG. 14, FIG. 15). Convergence of the estimation parameters m, $T_i$, $\kappa_i$ was obtained within few iterations (FIG. 14c), so the number of iterations was held fixed (total 5 iterations) for all patients and all image voxels. It sufficed to keep the parameter m constant for all voxels in one patient, but the parameter had to be optimized for each patient. For instance, the value was m=0.05 in the tumor patient, while it was increased to m=0.15 in the patient with fibromuscular dysplasia. Substituting a fixed Gaussian model for the dispersion of contrast in the human body $v_0$ is crude, but sufficed in for all patients in this study.

Blood volume was reduced when identifying the contrast first pass as proposed in this study, compare to identification using a gamma fit (Table 11).

TABLE 11

Relative cerebral blood volume computations.

| Model | Gray Matter | White Matter | Tumor I | Tumor II |
|---|---|---|---|---|
| 1 | 130 ± 5 | 98 ± 3 | 384 ± 10 | 322 ± 10 |
| 2 | 95 ± 7 | 69 ± 4 | 259 ± 14 | 228 ± 13 |
| 3 | 92 ± 5 | 63 ± 4 | 250 ± 12 | 222 ± 11 |
| 4 | 82 ± 5 | 55 ± 4 | 211 ± 11 | 183 ± 11 |

Mean value±standard deviation. Each region-of-interest (ROI) contained 6×6 voxels. Model 1) area under all measured time frames. Model 2) area under a fixed number of time frames (manual cut-off frame selected interactively but common for all image voxels). Model 3) area under gamma fitted first pass (non-linear Levenberg-Marquant least squares fit). Model 4) area under remaining first pass signal after recirculation and leakage terms have been removed as proposed in this paper. Units of ml/100 g scaled by a constant due to the normalized arterial input functions.

The proposed method also showed reduced variation in values within the regions of interest compared to blood volume computed using other strategies (Table 11).

The estimated leakage coefficients were similarly low for gray matter and white matter, $\kappa_i=1.6$, but elevated for the two tumor regions, $\kappa_i=5.7$ (FIG. 16). The circulation times $T_i$ were similar for white matter than for gray matter ($T_i=20.2$ seconds).

Iterative Deconvolution
Computer Simulations

In the absence of noise, the input flow values were exactly reproduced by the iterative blind deconvolution method in some simulated settings (FIG. 17a). Smaller variations in estimated flow values were however identified when using different parameter settings for the arterial input functions (FIG. 17a).

An arterial input functions with parameters a=3 and b=1.8, and an exponential tissue residue functions with MTT=4 seconds, reproduced close to true input flow values in the absence of noise (FIG. 17b). Mean flow values were also reproduced in the presence of increasing noise levels (results shown for N=0, 1, 2.5 and 4 in Eq. (31)). When noise levels were high (N=4), mean flow values were overestimated and the variance in the value was increased (FIG. 17b).

The iterative blind deconvolution method gave similar flow estimates for exponentially and linearly shaped tissue residue functions under reasonable noise conditions (N=1, Eq. (31)). Flow values were consistently lower for box-shaped tissue residue functions, (FIG. 17c). The input mean transit time value (4 seconds) was reproduced for all simulated flow values (FIG. 17d).

In Vivo Analysis

The arterial input functions estimated in two patients correlated well with the patients' blood supply pattern as diagnosed from the complete radiological examination (FIG. 18). In the tumor patient, the arrival of contrast is in parts of the tumor area as early as in the brain feeding arteries. The contrast then arrives in gray matter slightly earlier than in the white matter (FIG. 18, frames A ii and iii). In the dysplasia patient, contrast arrives earlier in the left hemisphere compared to the dysplasia-affected right area. The contrast bolus also passes slower through the middle right area, as can be seen by comparing the number of frames from contrast arrival to contrast washout in the left and right hemisphere. This is in good agreement with the collateral circulation that was identified in the right hemisphere from the patient's angiography examinations. Again, the contrast arrives normal gray matter earlier than normal white matter (FIG. 18, frames B ii and iii).

Detailed contrast washout dynamics were seen when visualizing the tissue residue functions as function of time (FIG. 19). In the tumor patient, an area with slower contrast washout was seen in the central part of the tumor (FIG. 19 vi, black arrow). Slower washout compared to the contralateral hemisphere was also seen in areas in the right hemisphere in the dysplasia patient.

For the patient with fibromuscular dysplasia in the right hemisphere, a gamma function with parameters (a=4.13, b=1.53) was found to represent the voxels with the earliest and largest signal change (FIG. 20, seven voxels). This gamma function was used as the arterial input function in the global approach. The time-to-peak map obtained in this patient using either the proposed or the conventional method, showed later time-to-peaks in the area normally supplied by the right middle cerebral artery (FIG. 20). Differences in time-to-peak were more apparent in the proposed method.

Region-of-interest analysis in the patient with fibromuscular dysplasia gave comparable hemodynamic parameters between the proposed method and conventional method (Table 12, FIG. 20). The mean transit time values obtained by the proposed method were slightly shorter than those obtained with the conventional method, but would probably even out if a smaller truncation factor than 0.2 would be selected for the current signal-to-noise ratio. The difference could also be explained by the different strategies for identifying the first pass. The variance in the mean transit time and time-to-peak values was lower for the proposed method. For the proposed method it was seen that the mean transit times in the affected right hemisphere (ROI 2,4,6) are longer than in healthy white matter (ROI 3,5), which again were longer than in healthy cortical gray matter (ROI 1). The corresponding values for the conventional method were less distinguishable, except for the lower most region (ROI6). In contradiction to the proposed method, both time-to-peak and mean transit time values were longer in ROI 6 than in the closely located ROI 4. The proposed method showed later and more dispersed arterial input functions in ROI 6 than in ROI 4 (FIG. 18, gray arrow).

TABLE 12

Region-of-interest (ROI) analysis.

| ROI | M1: MTT[s] | M1: TTP[s] | M2: MTT[s] | M2: TTP [s] |
|---|---|---|---|---|
| 1 | 4.4 ± 0.3 | 24.3 ± 0.6 | 5.8 ± 0.6 | 24.3 ± 0.5 |
| 2 | 4.8 ± 0.5 | 25.6 ± 1.4 | 5.4 ± 0.9 | 26.3 ± 1.4 |
| 3 | 4.6 ± 0.5 | 25.3 ± 0.8 | 5.2 ± 0.8 | 25.4 ± 1.0 |
| 4 | 5.6 ± 0.6 | 26.2 ± 1.0 | 5.1 ± 1.1 | 27.4 ± 1.5 |
| 5 | 4.7 ± 0.4 | 24.2 ± 0.7 | 5.5 ± 0.5 | 24.8 ± 0.9 |
| 6 | 5.4 ± 0.7 | 27.4 ± 1.0 | 7.2 ± 2.0 | 28.7 ± 1.0 |

Patient with right middle cerebral artery fibromuscular dysplasia. Mean values (standard deviation. M1: Iterative deconvolution after first pass identification with proposed leakage and recirculation modelling. M2: Truncated singular value decomposition after identification of first pass by only including the first 27 of 50 image frames.

The invention claimed is:
1. A method of perfusion magnetic resonance imaging of a region of interest in a vascularized animal subject, wherein said region of interest has substantial leakage across the capillary membranes, said method comprising:
administering a contrast agent bolus into the vascular system of said subject such that the contrast agent will make a least a first pass of the region of interest, wherein the first pass has a beginning and an end;

determining a magnetic resonance signal strength $s_i(t)$ for voxels (i) of said region of interest at a series of time values (t) over a period from before contrast agent arrival in said region of interest to at least the end of the first pass of said contrast agent through said region of interest;

from the determined values $s_i(t)$ for said signal strength and an arterial input function v(t), determining values for the tissue residue function $r_i(t)$ for each said voxel; and generating an image of said region of interest from the determined values of $r_i(t)$;

the improvement comprising generating from $s_i(t)$ a voxel specific arterial function for each said voxel $v_i(t)$ and using said voxel specific arterial functions to determine the values of the tissue residue function $r_i(t)$.

2. The method of claim 1 wherein the signal strength values are corrected for contrast agent leakage effects.

3. The method of claim 1 wherein the signal strength values are corrected for contrast agent recirculation effects.

4. The method of claim 1 wherein a contrast signal for each voxel is split into a first and second pass components with no leakage and with a leakage component.

5. The method of claim 1 wherein a Richardson-Lucy deconvolution algorithm is used to estimate the tissue residue function and subsequently estimate the arterial input function, then a Wiener deconvolution filter is used to find a new estimate of the tissue residue function from the estimate of the arterial input function.

6. The method of claim 5 wherein the Richardson-Lucy deconvolution algorithm and the Wiener deconvolution filter are used sequentially in an iterative loop.

7. The method of claim 6 wherein the loop is finished by finding a new estimate of the arterial input function using the Wiener deconvolution filter.

8. The method of claim 6 wherein the iterative loop is ended after six iterations.

9. The method of claim 5 wherein the Richardson-Lucy deconvolution algorithm is modified by the Poisson Bayes model or by regularization.

10. The method of claim 1 wherein the Richardson-Lucy deconvolution algorithm is used to estimate the tissue residue function and subsequently estimate the arterial input function.

11. The method of claim 10 wherein the Richardson-Lucy deconvolution algorithm is used in an iterative loop.

12. The method of claim 11 wherein the loop is finished by finding a new estimate of the arterial input function.

13. The method of claim 11 wherein the iterative loop is ended after six iterations.

14. The method of claim 10 wherein the Richardson-Lucy deconvolution algorithm modified by the Poisson Bayes model or by regularisation.

15. The method of claim 1 wherein a parametric perfusion image is generated.

16. The method of claim 15 wherein the Richardson-Lucy deconvolution algorithm is used to estimate the tissue residue function and subsequently estimate the arterial input function, then the Wiener deconvolution filter is used to find a new estimate of the tissue residue function from the estimate of the arterial input function.

17. The method of claim 15 wherein the Richardson-Lucy deconvolution algorithm is used to estimate the tissue residue function and subsequently estimate the arterial input function.

18. A method of perfusion magnetic resonance imaging data manipulation, said method comprising:

obtaining a set of magnetic resonance signal strength values $s_i(t)$ for voxels (i) of a region of interest in a vascularized subject into the vasculature of which a magnetic resonance contrast agent bolus has been administered such that the contrast agent will make a least a first pass of the region of interest, wherein said region of interest has substantial leakage across the capillary membranes, the first pass has a beginning and an end, said signal strength values being for a series of time values (t) over a period from before contrast agent arrival in said region of interest to at least the end of the first pass of said contrast agent through said region of interest;

from said set of signal strength values $s_i(t)$ and an arterial input function v(t), determining values for a tissue residue function $r_i(t)$ for each said voxel; and generating an image of said region of interest from the determined values of $r_i(t)$;

the improvement comprising generating from $s_i(t)$ a voxel specific arterial function for each said voxel $v_i(t)$ and using said voxel specific arterial functions to determine the values of the tissue residue function $r_i(t)$.

19. The method of claim 18 wherein the signal strength values are corrected for contrast agent leakage effects.

20. The method of claim 18 wherein the signal strength values are corrected for contrast agent recirculation effects.

21. The method of claim 18 wherein the contrast signal for each voxel is split into a first and second pass components with no leakage and with a leakage component.

22. The method of claim 18 wherein the Richardson-Lucy deconvolution algorithm is used to estimate the tissue residue function and subsequently estimate the arterial input function, then the Wiener deconvolution filter is used to find a new estimate of the tissue residue function from the estimate of the arterial input function.

23. The method of claim 18 wherein the Richardson-Lucy deconvolution algorithm is used to estimate the tissue residue function and subsequently estimate the arterial input function.

24. The method of claim 18 wherein a parametric perfusion image is generated.

25. A data processing apparatus for use in a method of perfusion magnetic resonance imaging of a region of interest in a vascularized animal subject, wherein said region of interest has substantial leakage across the capillary membranes, and said data processing apparatus comprises a processor configured for said method, said method comprising:

administering a contrast agent bolus into the vascular system of said subject; determining the magnetic resonance signal strength $s_i(t)$ for voxels (I) of said region of interest at a series of time values (t) over a period from before contrast agent arrival in said region of interest to at least the end of the first pass of said contrast agent through said region of interest;

from the determined values $s_i(t)$ for said signal strength and an arterial input function v(t), determining values for the tissue residue function $r_i(t)$ for each said voxel; and generating an image of said region of interest from the determined values of $r_i(t)$;

the improvement comprising generating from $s_i(t)$ a voxel specific arterial function for each said voxel $v_i(t)$ and using said voxel specific arterial functions to determine the values of the tissue residue function $r_i(t)$, the apparatus being configured to receive as an input a set of magnetic resonance signal strength values $s_i(t)$ for voxels (1) of a region of interest in a vascularized subject into the vasculature of which a magnetic resonance contrast agent bolus has been administered, said signal strength values being for a series of time values (t) over a period from before contrast agent arrival in said region of interest to at least the end of the first pass of said contrast agent through said region of interest, and to generate therefrom a voxel specific arterial function $v_i(t)$, a voxel specific tissue residue factor $r_i(t)$, and an image of said region of interest.

26. The data processing apparatus of claim 25 wherein the Richardson-Lucy deconvolution algorithm is used to estimate the tissue residue function and subsequently estimate the arterial input function, then the Wiener deconvolution filter is used to find a new estimate of the tissue residue function from the estimate of the arterial input function.

27. The data processing apparatus of claim 25 wherein the Richardson-Lucy deconvolution algorithm is used to estimate the tissue residue function and subsequently estimate the arterial input function.

28. A data processing apparatus for use in a method of perfusion magnetic resonance imaging of a region of interest in a vascularized animal subject, wherein said region of interest has substantial leakage across the capillary membranes, and said data processing apparatus comprises a processor configured for said method, said method comprising:

administering a contrast agent bolus into the vascular system of said subject; determining the magnetic resonance signal strength $s_i(t)$ for voxels (i) of said region of interest at a series of time values (t) over a period from before contrast agent arrival in said region of interest to at least the end of the first pass of said contrast agent through said region of interest;

from the determined values $s_i(t)$ for said signal strength and an arterial input function v(t), determining values for the tissue residue function $r_i(t)$ for each said voxel; and generating an image of said region of interest from the determined values of $r_i(t)$;

the improvement comprising generating from $s_i(t)$ a voxel specific arterial function for each said voxel $v_i(t)$ and using said voxel specific arterial functions to determine the values of the tissue residue function $r_i(t)$, the apparatus being configured to receive as an input a set of magnetic resonance signal strength values $s_i(t)$ for voxels (i) of a region of interest in a vascularized subject into the vasculature of which a magnetic resonance contrast agent bolus has been administered, said signal strength values being for a series of time values (t) over a period from before contrast agent arrival in said region of interest to at least the end of the first pass of said contrast agent through said region of interest, and to generate therefrom a voxel specific arterial function $v_i(t)$, a voxel specific tissue residue factor $r_i(t)$, and an image of said region of interest.

* * * * *